US012740475B2

(12) United States Patent
Brun et al.

(10) Patent No.: US 12,740,475 B2
(45) Date of Patent: Sep. 15, 2026

(54) SILICON NITRIDE LINER FOR PROMOTION OF MOLD ADHESION IN INTEGRATED CIRCUITS

(71) Applicant: Intel Corporation, Santa Clara, CA (US)

(72) Inventors: Xavier Francois Brun, Hillsboro, OR (US); Jason M. Gamba, Gilbert, AZ (US); Srinivas V. Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 616 days.

(21) Appl. No.: 17/470,404

(22) Filed: Sep. 9, 2021

(65) Prior Publication Data

US 2023/0076148 A1 Mar. 9, 2023

(51) Int. Cl.

*H01L 25/065* (2023.01)
*H10W 74/10* (2026.01)
*H10W 90/00* (2026.01)
*H10W 72/00* (2026.01)

(52) U.S. Cl.

CPC .......... *H10W 90/00* (2026.01); *H10W 74/114* (2026.01); *H10W 72/823* (2026.01)

(58) Field of Classification Search

None

See application file for complete search history.

(56) References Cited

U.S. PATENT DOCUMENTS 10,734,572 B2 * 8/2020 Jiang ................. H01L 21/76816
2008/0150127 A1 6/2008 Raravikar et al.
2019/0371621 A1 12/2019 Darmawikarta et al.
2019/0385977 A1 12/2019 Elsherbini et al.
2020/0028067 A1 * 1/2020 Jiang ...................... H10B 61/00
2021/0159248 A1 5/2021 Zhang et al.
2021/0391317 A1 12/2021 Wu et al.

OTHER PUBLICATIONS

Brun, Xavier F. et al., “Investigation of Low Stress and Low Temperature SiN and SiCN PVD Films for Advanced Packaging Applications”, 2021 IEEE 71st Electronic Components and Technology Conference (ECTC), 2021, pp. 2111-2117.

* cited by examiner

*Primary Examiner* — Long Pham
(74) *Attorney, Agent, or Firm* — Akona IP PC

(57) ABSTRACT

An example an IC package including a liner for promotion of mold adhesion includes a conductive structure on a support surface; a mold material at least partially encasing the conductive structure; and a liner on a surface of the conductive structure between the surface of the conductive structure and the mold material, wherein the liner comprises a material including silicon and nitrogen.

20 Claims, 22 Drawing Sheets

522
512
532
508
506
504
503
502
530

622
612
608
606
604
603
602
620

622
612
632
608
606
604
603
602
630

2300
2304
2306
2316
2336
2340
2322
2302
2342
2324
2330
2326
2332
2314
2310
2308
2318
2320
2328
2334

SILICON NITRIDE LINER FOR PROMOTION OF MOLD ADHESION IN INTEGRATED CIRCUITS

TECHNICAL FIELD

The present disclosure relates to integrated circuit (IC) devices and assemblies. More specifically, it relates to using a liner including silicon and nitrogen for promotion of mold adhesion in IC packages.

BACKGROUND

As transistor density increases with each new silicon node, yielding large, monolithic dies has become increasingly difficult, leading to an industry push toward die disaggregation. Three-dimensional (3D) packaging architecture, for example, addresses these issues using direct connections from a package support to one or more second level dies using large copper pillars in a base complex, which may also be referred to herein as an interposer, and one or more dies embedded in the base complex. Base complex interconnects may be defined with micrologic bumps (MLBs) between the base complex to the second level die or package side bumps (PSBs) between the base complex and the package support to bridge a routing gap between the top chip and the package support.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
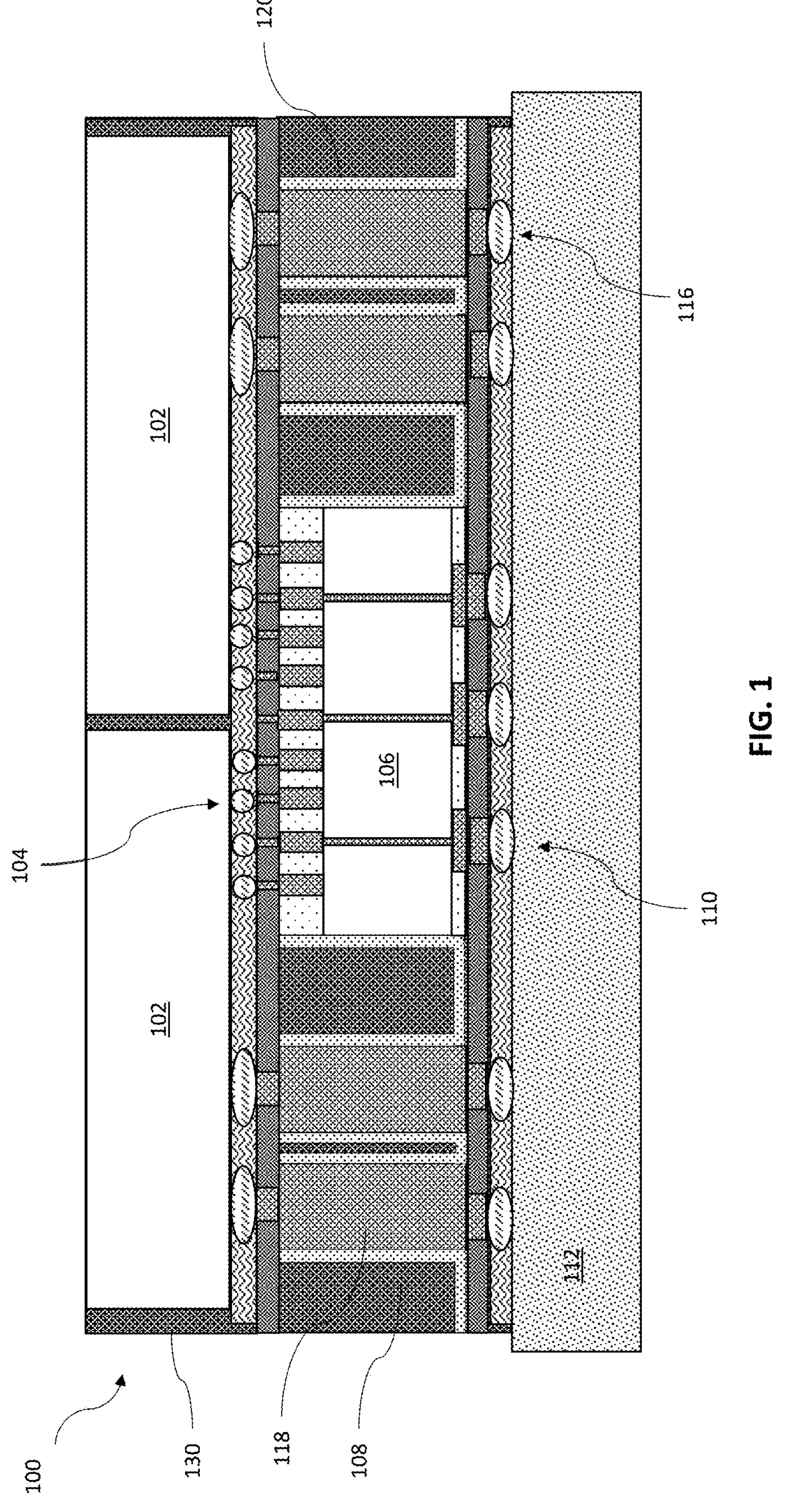
FIG. 1 is a schematic cross-sectional view of an example IC package including a base complex with copper pillar and first level die sidewall liners, according to some embodiments of the present disclosure.

For purposes of illustrating embodiments described herein, it is important to understand phenomena that may come into play during packaging of IC structures. The following foundational information may be viewed as a basis from which the present disclosure may be properly explained. Such information is offered for purposes of explanation only and, accordingly, should not be construed in any way to limit the broad scope of the present disclosure and its potential applications.

In certain 3D packaging architectures architecture today, several mold-to-mold interfaces exist. In addition to mold-to-mold delamination risks, risk of delamination at mold-to-copper pillar and mold-to-embedded chip interfaces also exists. There are significant challenges in identifying a mold material that is capable of mold underfill (MUF) and is also chemical mechanical polishing (CMP) compatible.

Embodiments described herein address these delamination issues by adding an intermediate adhesion layer between the copper pillar and mold material, as well as between one or more surfaces of the first level die and mold material. In certain embodiments, the adhesion layer includes silicon nitride (SiN).

In one aspect of the present disclosure, an example of an IC package includes a conductive structure, a mold material at least partially encasing the conductive structure, and a liner on a surface of the conductive structure between the surface of the conductive structure and the mold material, where the liner comprises a material including silicon and nitrogen.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pits or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional illustration of a package 100, according to some embodiments of the present disclosure. As shown in FIG. 1, package 100 may include one or more IC dies, represented in FIG. 1 by dies 102, each of which may include electrical devices including but not limited to processing units (XPUs), electronic integrated circuits (EICs), and memory, for example. Dies 102 may comprise a semiconductor material including, for example, N-type or P-type materials. Dies 102 may include, for example, a crystalline substrate formed using a bulk silicon (or other bulk semiconductor material) or a semiconductor-on-insulator (SOI, e.g., a silicon-on-insulator) structure. In some embodiments, dies 102 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, dies 102 may comprise a non-crystalline material, such as polymers. In some embodiments, dies 102 may be inhomogeneous, including a carrier material (such as glass or silicon carbide) as a substrate with a thin semiconductor layer over which is an active side of the die 102. Although a few examples of the material for dies 102 are described here, any material or structure that may serve as a foundation upon which IC circuits and structures as described herein may be built falls within the spirit and scope of the present disclosure as dies 102.

In the illustrated embodiment, dies 102 may be electrically coupled by way of interconnects 104 to one or more dies, represented in FIG. 1 by a die 106, in mold material 108, such as an epoxy molding compound (EMC) that may function as an interposer. In order to readily distinguish dies 102 from die 106, dies 102 may be referred to herein as "second level dies" or alternatively as "top dies," while die 106 may be referred to herein as a "first level die" or alternatively as an "embedded die." Interconnects 104 may comprise die-to-die (DTD) interconnects along with associated conductive traces, planes, vias, redistribution layers (RDLs), and pads enabling electrical coupling between second level dies 102 and first level die 106. Note that some component parts of interconnects are shown in FIG. 1 but are not labeled separately so as to not clutter the drawing. In some embodiments, interconnects 104 may comprise flip-chip interconnects that enable package 100 to achieve a smaller footprint and higher die-to-package-package support connection density than could be achieved using conventional wire-bond techniques, in which conductive contacts between second level dies 102 and first level die 106 are located on a periphery of second level dies 102 and/or first level die 106. For example, one of second level dies 102 having a square shape with side length N may be able to form 4N wire-bond interconnects, versus $N^2$ flip-chip interconnects utilizing the entire "full field" surface area of second level die 102. Implementing interconnects 104 in a high-density configuration may enable package 100 to have much lower parasitic inductance relative to using wire-bonds, which may result in improved signal integrity for high-speed signals between second level dies 102 and first level die 106.

In addition, by co-packaging second level dies 102 with first level die 106 using interconnects 104 in a high-density configuration, input/output power can be reduced by limiting electrical signaling to intra-package distances while also reducing cost and signal loss (among other advantages). The three-dimensional (3D) stacked architecture can lower power requirements for data transfer, for example, to 2-3 picojoules/bit. The high-density configuration can also enable serialization of electromagnetic signals in second level dies 102, further allowing fewer number of electrical interconnects with first level die 106. In some example embodiments, interconnects 104 may be formed with a high-density pitch between approximately 18 and 36 micrometer. In an example embodiment, interconnects 104 may be formed with a high-density pitch of 25 micrometer.

In some embodiments, first level die 106 may comprise an IC configured to electrically integrate with one or more of second level dies 102 to achieve an intended functionality of package 100. For example, first level die 106 may be an Application Specific IC (ASIC), such as a switch circuit or driver/receiver circuit used in optical communication systems. In some embodiments, first level die 106 may comprise a bridge circuit, for example, including an embedded multi-die interconnect bridge having appropriate circuitry on/in a semiconductor substrate to connect at silicon-interconnect speeds with a small footprint as part of certain packaging architectures. In some embodiments, on or more of first level die 106 may comprise active components, including one or more transistors, voltage converters, trans-impedance amplifiers (TIA), clock and data recovery (CDR) components, microcontrollers, etc. In some embodiments, first level die 106 may comprise passive circuitry sufficient to enable interconnection to second level dies 102 and other components in package 100 without any active components. In some embodiments, first level die 106 may extend under a substantial area of second level dies 102; in other embodiments, first level die 106 may overlap with second level dies 102 along one or more edges. In various embodiments, first level die 106 and second level dies 102 may overlap sufficiently to enable disposing interconnects 104 with a desired pitch and number of interconnections that enable package 100 to function appropriately.

In various embodiments, mold material 108 may comprise any suitable mold material or EMC. In alternative embodiments, mold material 108 may include dry film dielectrics, such as Ajinomoto build-up film (ABF) or sheet mold. The 3D architecture as illustrated can allow a smaller footprint overall for package 100.

Interconnects 110 comprising die-to-package-substrate (DTPS) interconnects, and associated conductive traces, planes, vias, RDLs, and pads may provide electrical coupling between first level die 106 and a package support 112. First level die 106 may alternatively be coupled to package support 112 using other means for electrically and/or physically coupling an IC to a package support, such as with die attach film (DAF). In various embodiments, package support 112 may comprise a single or multi-layered insulating material with metallization including planes, traces, vias, and passive components (e.g., inductors, capacitors) within the insulating material and/or on the surfaces. Package support 112 may comprise ceramic (e.g., alumina) and/or organic material (e.g., epoxy based FR4, resin based bismaleimide triazine (BT), or polyimide) and may be formed in various varieties including rigid and tape. Package support 112 may provide mechanical base support and appropriate interfaces to access components in package 100 electrically. Interconnects 116 comprising DTPS interconnects, and associated conductive traces, planes, vias, RDLs, copper pillars 118, and pads may provide electrical coupling between second level dies 102 and package support 112.

Interconnects 110 and 116 may comprise any suitable interconnection, including flip-chips and ball grid array (BGA) with corresponding metallization, pads and vias, including through-substrate-vias (TSVs) through first level die 106 or through-hole vias also called through-mold-vias (TMVs) through mold material 108. Note that the shapes of various interconnects shown in the figure are merely for illustrative purposes and are not to be construed as limitations. The shapes of interconnects 104, 110, and/or 116, for example, may result from natural processes occurring during solder reflow. The shapes may depend on material viscosity in liquid state, temperatures of processing, surface tension forces, capillary action, and other mechanisms beyond the scope of the present disclosure. Interconnects 104, 110, and 116, can enable a stacked packaging architecture that enables low power, low loss, high-speed electrical signals between second level dies 102 and first level die 106. Such packaging architectures allow for IC chips to communicate with each other horizontally or vertically, permitting smaller footprint, higher speeds, and reduced power usage for package 100.

It will be recognized that one more levels of underfill and/or solder resist (e.g., organic polymer material such as benzotriazole, imidazole, polyimide, or epoxy) may be provided in package 100 and are not labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. In some embodiments, solder resist may be a liquid or dry film material including photo-imageable polymers. In some embodiments, solder resist may be non-photo-imageable.

Referring again to FIG. 1, as will be described in greater detail below with reference to FIGS. 4A-4E, in accordance with features of embodiments described herein, a liner 120 is provided at a one or more interfaces of mold material 108 and side surfaces of copper pillars 118 and die 106 to promote adhesion of mold material to those surfaces. In particular embodiments, liner 120 comprises a Silicon Nitride (SiN) film. The ratio of silicon to nitrogen in the liner 120 may be approximately 3 to 4. Depending on the deposition process used, hydrogen and/or oxygen may also be present in liner 120 in small quantities. In certain embodiments, the thickness of liner 120 may be between 100 nanometer and 1 micrometer.

Second level dies 102 may be encased by a mold 130. In some embodiments, mold 130 may extend to the surfaces of second level dies 102 distant from interposer without overlapping on such surfaces, thereby exposing second level dies 102 for direct connection of heat sinks, identifying markers, etc. In some embodiments, mold 130 may cover the surfaces of second level dies 102 distant from interposer.

Although not specifically shown in all of the present illustrations in order to not clutter the drawings, when DTD or DTPS interconnects are described, a surface of a first IC (or die) may include a first set of conductive contacts, and a surface of a second IC (or die) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same. In some embodiments, the DTPS interconnects disclosed herein may have a pitch between approximately 80 micrometer and 300 micrometer, while the DTD interconnects disclosed herein may have a pitch between approximately 7 micrometer and 36 micrometer. In an example embodiment, some DTD interconnects have a pitch of 25 micrometer.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

Various conductive contacts used in package 100, for example, conductive contacts that form part of interconnects 104, 110, 116, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of second level dies 102 and first level die 106 in contact with solder may be covered by a suitable solder mask material (not shown) that prevents solder from melting and bridging adjacent contacts during solder reflow.

In various embodiments, more or fewer elements described above may be included in package 100, compared to what is shown in FIG. 1. In some embodiments, conductive metallization lines may extend into and out of the plane of the drawing, providing conductive pathways to route electrical to and/or from various elements in package 100. The conductive vias and/or lines that provide conductive pathways in/on the package 100 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as oxide material or nitride material, may insulate various structures in the conductive pathways from proximate structures, and/or may serve as etch stops during fabrication. In some embodiments, additional layers, such as diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

Note that in the figure, interconnects 104, 110, 116, may be shown aligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on second level dies 102 and first level die 106 may enable any desired placement of solder balls with respect to vias and other circuitry. In a general sense, interconnect structures may be arranged within package 100 to route electrical signals according to a wide variety of designs. During operation of package 100, electrical signals (such as power, input/output (I/O) signals, including various control signals for external and internal control of dies 102) may be routed to and/or from dies 102 through the conductive contacts and conductive pathways of package 100.

Note that FIG. 1 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 1 may include multiple second level dies 102 and/or first level die 106, along with other electrical components.

Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 1 herein may be combined with any other features to form a package as described herein, for example, to form a modified package 100. Some such combinations are described above, but, in various embodiments, further combinations and modifications are possible.

Figure 2:
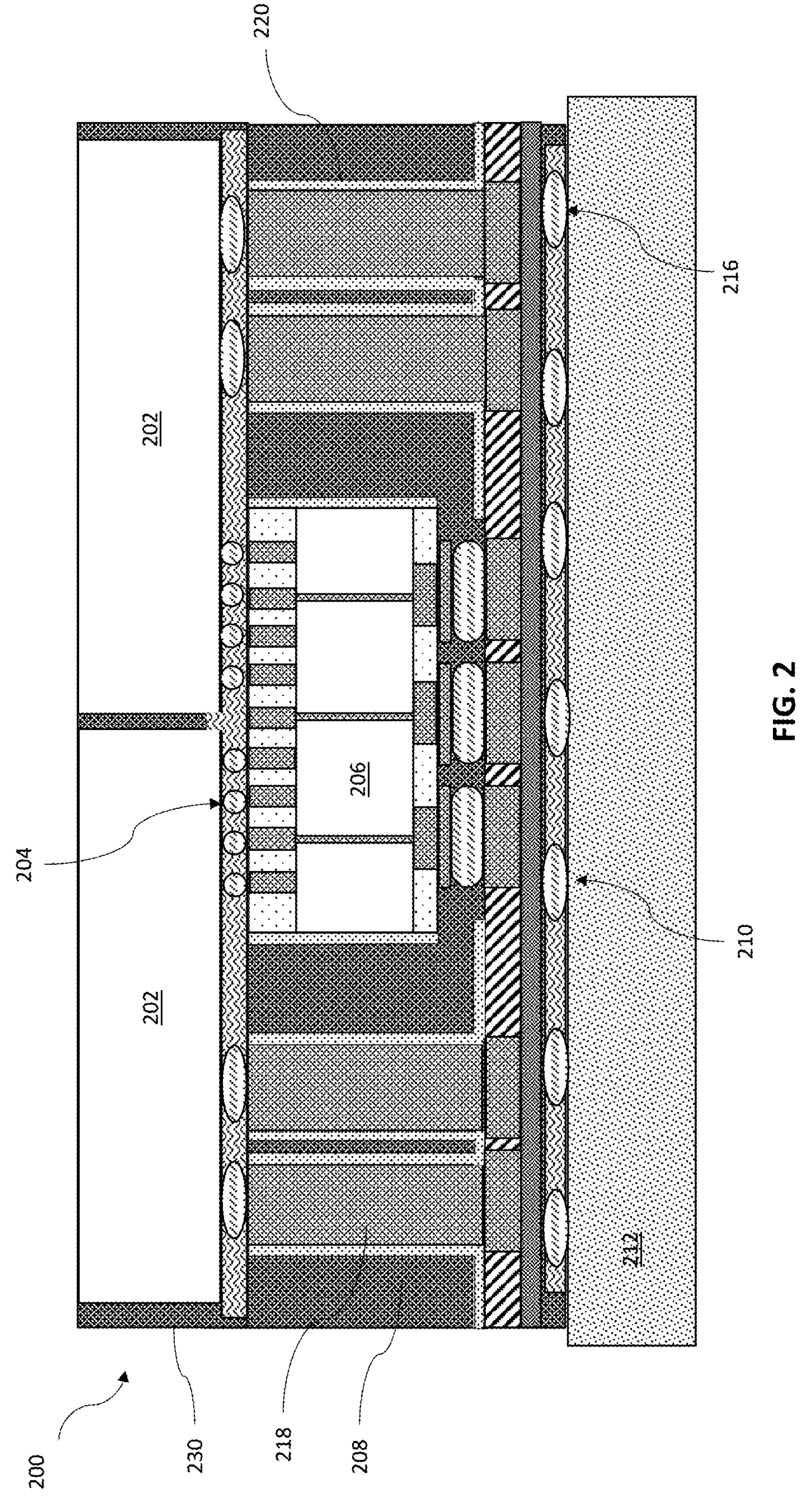
FIG. 2 is a schematic cross-sectional view of another example IC package including a base complex with copper pillar and first level die sidewall liners, according to some embodiments of the present disclosure.

FIG. 2 is a schematic cross-sectional illustration of a package 200, according to some embodiments of the present disclosure. Descriptions of package 100 and elements thereof provided with reference to FIG. 1 are applicable to package 200 and elements thereof shown in FIG. 2 and therefore, in the interest of brevity, may not repeated, with only additional features or differences being described in certain cases.

As shown in FIG. 2, package 200 may include one or more IC dies, represented in FIG. 2 by dies 202. In the illustrated embodiment, dies 202 may be electrically coupled by way of interconnects 204 to one or more dies, represented in FIG. 2 by a die 206, in a mold material 208, such as an EMC, that may function as an interposer. As previously noted, in order to readily distinguish dies 202 from die 206, dies 202 may be referred to herein as "second level dies" or alternatively as "top dies," while die 206 may be referred to herein as a "first level die" or alternatively as an "embedded die." Interconnects 204 may comprise DTD interconnects along with associated conductive traces, planes, vias, RDLs, and pads enabling electrical coupling between second level dies 202 and first level die 206. Note that some component parts of interconnects are shown in FIG. 2 but are not labeled separately so as to not clutter the drawing. In some embodiments, interconnects 204 may comprise flip-chip interconnects that enable package 200 to achieve a smaller footprint and higher DTPS connection density than could be achieved using conventional wire-bond techniques as described above.

In some embodiments, first level die 206 may comprise an IC configured to electrically integrate with one or more of second level dies 202 to achieve an intended functionality of package 200. For example, first level die 206 may be an ASIC, such as a switch circuit or driver/receiver circuit used in optical communication systems. In some embodiments, first level die 206 may comprise a bridge circuit, for example, including an embedded multi-die interconnect bridge having appropriate circuitry on/in a semiconductor substrate to connect at silicon-interconnect speeds with a small footprint as part of certain packaging architectures. In some embodiments, on or more of first level die 206 may comprise active components. In some embodiments, first level die 206 may comprise passive circuitry sufficient to enable interconnection to second level dies 202 and other components in package 200 without any active components. In some embodiments, first level die 206 may extend under a substantial area of second level dies 202; in other embodiments, first level die 206 may overlap with second level dies 202 along one or more edges. In various embodiments, first level die 206 and second level dies 202 may overlap sufficiently to enable disposing interconnects 204 with a desired pitch and number of interconnections that enable package 200 to function appropriately.

In various embodiments, mold material 208 may comprise any suitable mold material or EMC. In alternative embodiments, mold material 208 may include dry film dielectrics, such as ABF or sheet mold. The 3D architecture as illustrated can allow a smaller footprint overall for package 200.

Interconnects 210 comprising DTPS interconnects, and associated conductive traces, planes, vias, RDLs, and pads may provide electrical coupling between first level die 206 and a package support 212. First level die 206 may alternatively be coupled to package support 212 using other means for electrically and/or physically coupling an IC to a package support, such as with DAF. In various embodiments, package support 212 may comprise a single or multi-layered insulating material with metallization including planes, traces, vias, and passive components (e.g., inductors, capacitors) within the insulating material and/or on the surfaces. Package support 212 may comprise ceramic (e.g., alumina) and/or organic material (e.g., epoxy based FR4, resin based BT, or polyimide) and may be formed in various varieties including rigid and tape. Package support 212 may provide mechanical base support and appropriate interfaces to access components in package 200 electrically. Interconnects 216 comprising DTPS interconnects, and associated conductive traces, planes, vias, copper pillars 218, RDLs, and pads may provide electrical coupling between second level dies 202 and package support 212.

Interconnects 210 and 216 may comprise any suitable interconnection, including flip-chips and BGA with corresponding metallization, pads and vias, including TSVs through first level die 206 or TMVs through interposer 208. Note that the shapes of various interconnects shown in the figure are merely for illustrative purposes and are not to be construed as limitations. The shapes of interconnects 204, 210, and/or 216, for example, may result from natural processes occurring during solder reflow. The shapes may depend on material viscosity in liquid state, temperatures of processing, surface tension forces, capillary action, and other mechanisms beyond the scope of the present disclosure. Interconnects 204, 210, and 216, can enable a packaging architecture that enables low power, low loss, high-speed electrical signals between second level dies 202 and first level die 206. Such packaging architectures allow for IC chips to communicate with each other horizontally or vertically, permitting smaller footprint, higher speeds, and reduced power usage for package 200.

It will be recognized that one more levels of underfill and/or solder resist may be provided in package 200 and are not labeled in order to avoid cluttering the drawings.

Referring again to FIG. 2, as will be described in greater detail below with reference to FIGS. 5A-5E, in accordance with features of embodiments described herein, a liner 220 is provided at a one or more interfaces of mold material 208 and side surfaces of copper pillars 218 and die 206 to promote adhesion of mold material to those surfaces. In particular embodiments, liner 220 comprises a SiN film. The ratio of silicon to nitrogen in the liner 120 may be approximately 3 to 4. Depending on the deposition process used, hydrogen and/or oxygen may also be present in liner 220 in small quantities. In certain embodiments, the thickness of liner 220 may be between 100 nanometer and 1 micrometer.

Second level dies 202 may be encased by a mold 230. In some embodiments, mold 230 may extend to the surfaces of second level dies 202 distant from interposer 208 without overlapping on such surfaces, thereby exposing second level dies 202 for direct connection of heat sinks, identifying markers, etc. In some embodiments, mold 230 may cover the surfaces of second level dies 202 distant from interposer 208.

Various conductive contacts used in package 200, for example, conductive contacts that form part of interconnects 204, 210, 216, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of second level dies 202 and first level die 206 in contact with solder may be covered by a suitable solder mask material (not shown) that prevents solder from melting and bridging adjacent contacts during solder reflow.

In various embodiments, more or fewer elements described above may be included in package 200, compared to what is shown in FIG. 2.

Note that in the figure, interconnects 204, 210, 216, may be shown aligned or unaligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on second level dies 202 and first level die 206 may enable any desired placement of solder balls with respect to vias and other circuitry. In a general sense, interconnect structures may be arranged within package 200 to route electrical signals according to a wide variety of designs. During operation of package 200, electrical signals (such as power, input/output (I/O) signals, including various control signals for external and internal control of dies 202) may be routed to and/or from dies 202 through the conductive contacts and conductive pathways of package 200.

Note that FIG. 2 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 2 may include multiple second level dies 202 and/or first level die 206, along with other electrical components.

Additionally, although some components of the assemblies are illustrated in FIG. 2 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 2 herein may be combined with any other features to form a package as described herein, for example, to form a modified package 200. Some such combinations are described above, but, in various embodiments, further combinations and modifications are possible.

Figure 3:
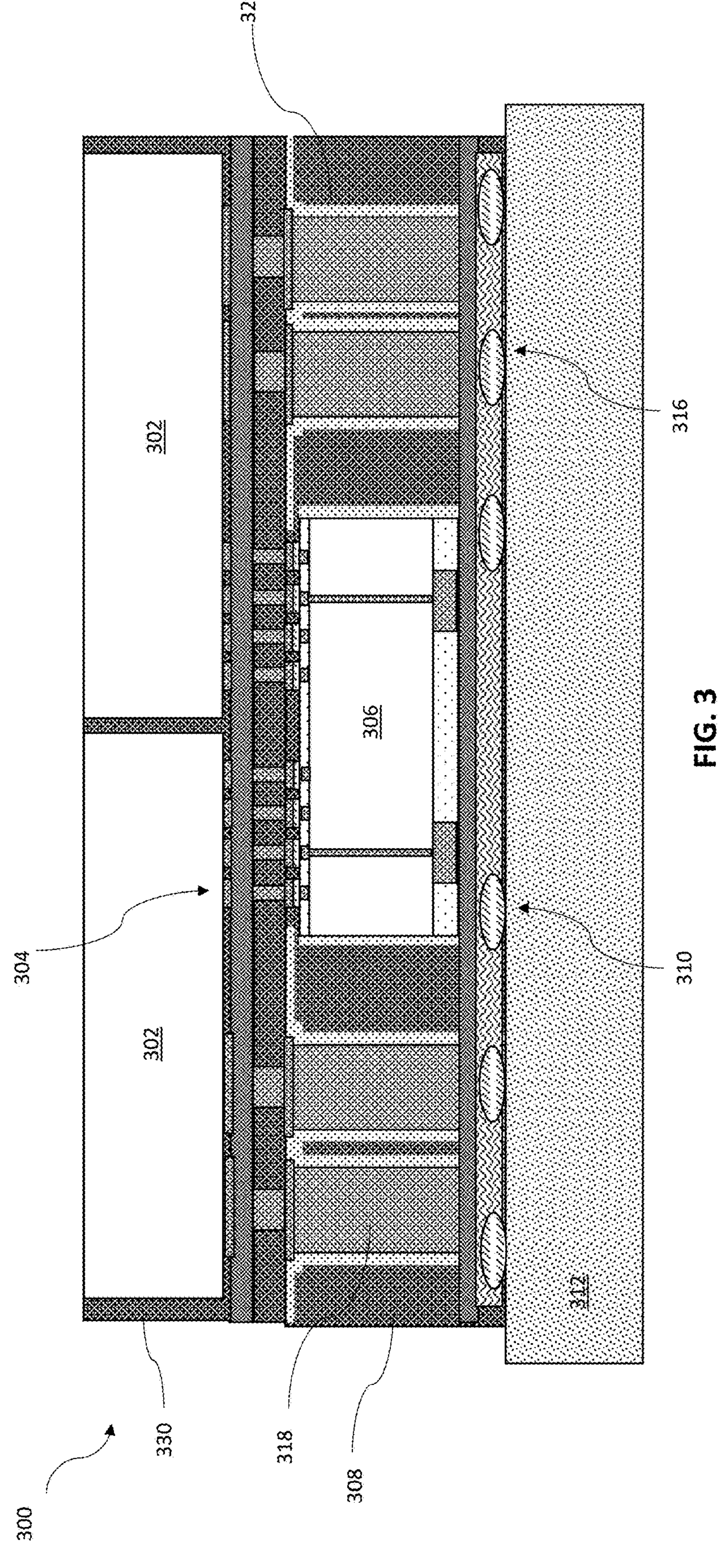
FIG. 3 is a schematic cross-sectional view of another example IC package including a base complex with copper pillar and first level die sidewall liners, according to some embodiments of the present disclosure.

FIG. 3 is a schematic cross-sectional illustration of a package 300, according to some embodiments of the present disclosure. Descriptions of package 100 and elements thereof provided with reference to FIG. 1 are applicable to package 300 and elements thereof shown in FIG. 3 and, therefore, in the interest of brevity, may not repeated, with only additional features or differences being described in certain cases.

As shown in FIG. 3, package 300 may include one or more IC dies, represented in FIG. 3 by dies 302. In the illustrated embodiment, dies 302 may be electrically coupled by way of interconnects 304 to one or more dies, represented in FIG. 3 by a die 306, in a mold material 308, which in illustrated embodiments may include an interposer. As previously noted, in order to readily distinguish dies 302 from die 306, dies 302 may be referred to herein as "second level dies" or alternatively as "top dies," while die 306 may be referred to herein as a "first level die" or alternatively as an "embedded die." Interconnects 304 may comprise DTD interconnects along with associated conductive traces, planes, vias, RDLs, and pads enabling electrical coupling between second level dies 302 and first level die 306. Note that some component parts of interconnects are shown in FIG. 3 but are not labeled separately so as to not clutter the drawing. In some embodiments, interconnects 304 may comprise flip-chip interconnects that enable package 300 to achieve a smaller footprint and higher die-to-package-package support connection density than could be achieved using conventional wire-bond techniques as described above.

In some embodiments, first level die 306 may comprise an IC configured to electrically integrate with one or more of second level dies 302 to achieve an intended functionality of package 300. For example, first level die 306 may be an Application Specific IC (ASIC), such as a switch circuit or driver/receiver circuit used in optical communication systems. In some embodiments, first level die 306 may comprise a bridge circuit, for example, including an embedded multi-die interconnect bridge having appropriate circuitry on/in a semiconductor substrate to connect at silicon-interconnect speeds with a small footprint as part of certain packaging architectures. In some embodiments, on or more of first level die 306 may comprise active components. In some embodiments, first level die 306 may comprise passive circuitry sufficient to enable interconnection to second level dies 302 and other components in package 300 without any active components. In some embodiments, first level die 306 may extend under a substantial area of second level dies 302; in other embodiments, first level die 306 may overlap with second level dies 302 along one or more edges. In various embodiments, first level die 306 and second level dies 302 may overlap sufficiently to enable disposing interconnects 304 with a desired pitch and number of interconnections that enable package 300 to function appropriately.

In various embodiments, mold material 308 may comprise any suitable mold material or EMC. In alternative embodiments, mold material 308 may include dry film dielectrics, such as ABF or sheet mold. The 3D architecture as illustrated can allow a smaller footprint overall for package 300.

Interconnects 310 comprising DTPS interconnects, and associated conductive traces, planes, vias, RDLs, and pads may provide electrical coupling between first level die 306 and a package support 312. First level die 306 may alternatively be coupled to package support 312 using other means for electrically and/or physically coupling an IC to a package support, such as with DAF. In various embodiments, package support 312 may comprise a single or multi-layered insulating material with metallization including planes, traces, vias, and passive components (e.g., inductors, capacitors) within the insulating material and/or on the surfaces. Package support 312 may comprise ceramic (e.g., alumina) and/or organic material (e.g., epoxy based FR4, resin based BT, or polyimide) and may be formed in various varieties including rigid and tape. Package support 312 may provide mechanical base support and appropriate interfaces to access components in package 300 electrically. Interconnects 316 comprising DTPS interconnects, and associated conductive traces, planes, vias, copper pillars 318, RDLs, and pads may provide electrical coupling between second level dies 302 and package support 312.

Interconnects 310 and 316 may comprise any suitable interconnection, including flip-chips and BGA with corresponding metallization, pads and vias, including TSVs through first level die 306 or TMVs through interposer 308. Note that the shapes of various interconnects shown in the figure are merely for illustrative purposes and are not to be construed as limitations. The shapes of interconnects 304, 305, 310, and/or 316, for example, may result from natural processes occurring during solder reflow. The shapes may depend on material viscosity in liquid state, temperatures of processing, surface tension forces, capillary action, and other mechanisms beyond the scope of the present disclosure. Interconnects 304, 310, and 316, can enable a packaging architecture that enables low power, low loss, high-speed electrical signals between second level dies 202 and first level die 206. Such packaging architectures allow for IC chips to communicate with each other horizontally or vertically, permitting smaller footprint, higher speeds, and reduced power usage for package 300.

It will be recognized that one more levels of underfill and/or solder resist may be provided in package 300 and are not labeled in order to avoid cluttering the drawings.

Referring again to FIG. 3, as will be described in greater detail below with reference to FIGS. 6A-6E, in accordance with features of embodiments described herein, a liner 320 is provided at a one or more interfaces of mold material 308 and side surfaces of copper pillars 318 and die 306 to promote adhesion of mold material to those surfaces. In particular embodiments, liner 320 comprises a SiN film. The ratio of silicon to nitrogen in the liner 320 may be approximately 3 to 4. Depending on the deposition process used, hydrogen and/or oxygen may also be present in liner 320 in small quantities. In certain embodiments, the thickness of liner 320 may be between 100 nanometer and 1 micrometer.

Second level dies 302 may be encased by a mold 330. In some embodiments, mold 330 may extend to the surfaces of second level dies 302 distant from interposer 308 without overlapping on such surfaces, thereby exposing second level dies 302 for direct connection of heat sinks, identifying markers, etc. In some embodiments, mold 330 may cover the surfaces of second level dies 302 distant from interposer 308.

Various conductive contacts used in package 300, for example, conductive contacts that form part of interconnects 304, 310, 316, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of second level dies 302 and first level die 306 in contact with solder may be covered by a suitable solder mask material (not shown) that prevents solder from melting and bridging adjacent contacts during solder reflow.

In various embodiments, more or fewer elements described above may be included in package 300, compared to what is shown in FIG. 3.

Note that in the figure, interconnects 304, 310, 316, may be shown aligned or unaligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on second level dies 302 and first level die 306 may enable any desired placement of solder balls with respect to vias and other circuitry. In a general sense, interconnect structures may be arranged within package 300 to route electrical signals according to a wide variety of designs. During operation of package 300, electrical signals (such as power, input/output (I/O) signals, including various control signals for external and internal control of dies 302) may be routed to and/or from dies 302 through the conductive contacts and conductive pathways of package 300.

Note that FIG. 3 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 3 may include multiple second level dies 302 and/or first level die 306, along with other electrical components.

Additionally, although some components of the assemblies are illustrated in FIG. 3 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 3 herein may be combined with any other features to form a package as described herein, for example, to form a modified package 300. Some such combinations are described above, but, in various embodiments, further combinations and modifications are possible.

As shown in FIGS. 1-3, packages 100 and 200 are examples of top-die-last package architectures, whereas package 300 is an example of a top-die-first architecture.

Example Methods

FIGS. 4A-4E are schematic cross-sectional illustrations of various stages in an example process for fabricating a base complex of an example IC package, such as package 100, according to some embodiments of the present disclosure. Although FIGS. 4A-4E illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 4A-4E may be modified in accordance with the present disclosure to fabricate other embodiments and/or components of package 100 as disclosed herein.

Figure 4A:
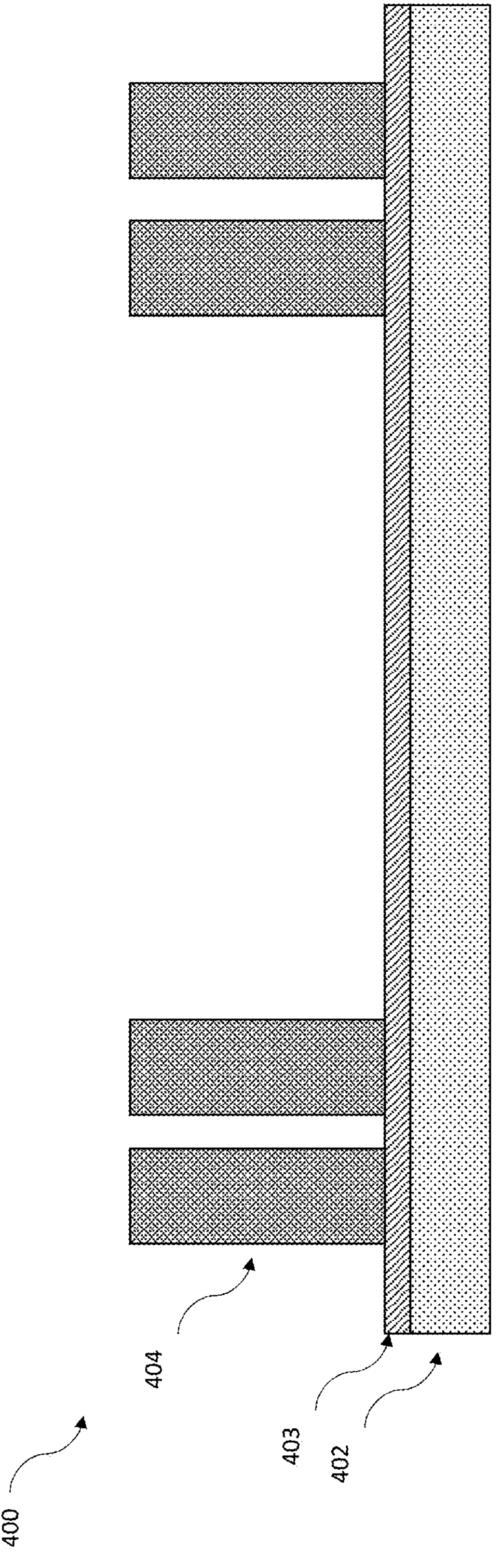
FIGS. 4A-4E are schematic cross-sectional illustrations of various stages in an example process for fabricating the base complex of the example IC package of FIG. 1, according to some embodiments of the present disclosure.

FIG. 4A illustrates a microelectronics assembly 400 (alternatively referred to herein as simply "assembly") including a carrier 402 and a base complex package support surface 403 plated or otherwise deposited with conductive material, such as copper, to generate traces (not shown), planes (not shown), and pillars 404. In certain embodiments, package support surface 403 includes a release layer and/or multiple layers of patterned metal and dielectric circuitry. Release layer may include any material, including organic material, enabling release of the base complex from the carrier 402 later in the process and may include a laser release film, a thermal release film and/or a mechanical release/peel layer. Any suitable manufacturing technique (such as additive, subtractive, semi-additive, etc.) may be used to manufacture assembly 400 as shown in FIG. 4A. In various embodiments, the metallization may be formed using any known process in the art, including electroplating, photolithography, etc. In various embodiments, carrier 402 may comprise a semiconductor material. In some embodiments, carrier 402 may comprise any rigid, non-conductive material, such as alumina, that can provide mechanical support to the deposited metallization. In various embodiments, the metallization may comprise copper; in some embodiments, the metallization may comprise aluminum; in some embodiments, the metallization may comprise metal alloys of various compositions. Additionally, although pillars 404 are shown as being arranged in pairs, it will be recognized that pillars may be positioned in various locations on carrier 402 with respect to other elements thereon without departing from the spirit or scope of embodiments described herein.

Figure 4B:
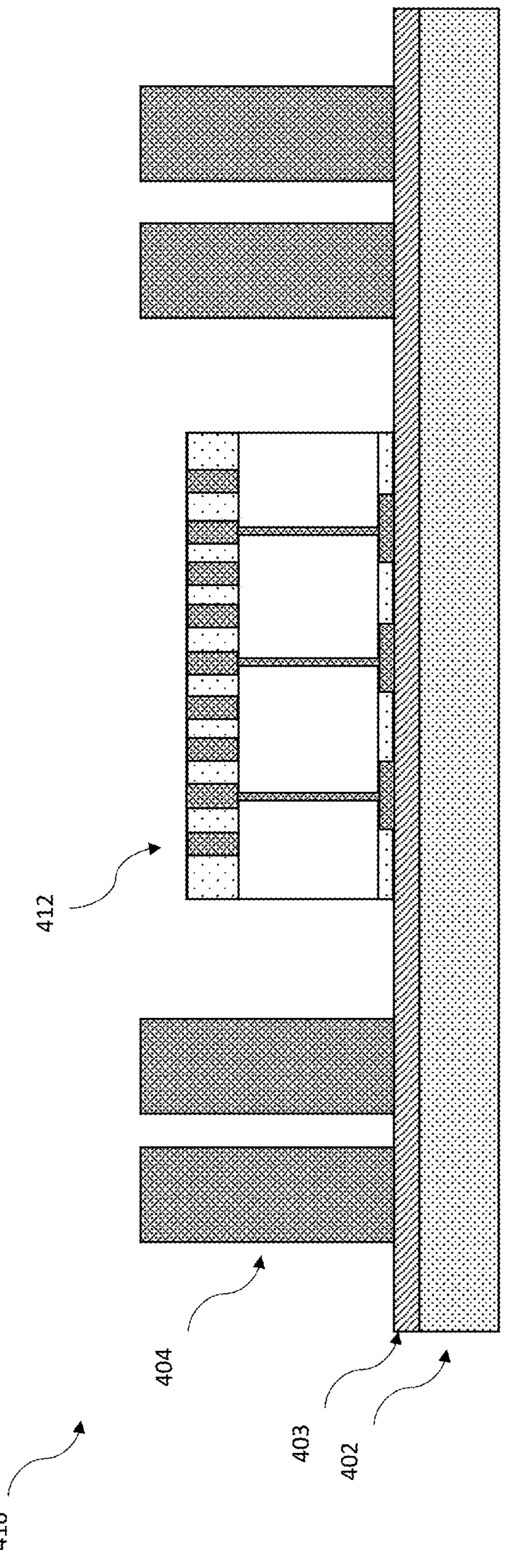

FIG. 4B illustrates an assembly 410 that includes assembly 400 (FIG. 4A) to which an IC structure 412 has been attached to support surface 403 of the carrier 402. Although IC structure 412 is shown as being positioned between pillars 404, it will be recognized that die may be positioned in various locations over carrier 402 with respect to pillars without departing from the spirit or scope of embodiments described herein. As illustrated in FIG. 4B, IC structure 412 is attached to support surface 403 on carrier 402 by a DAF (not shown).

Figure 4C:
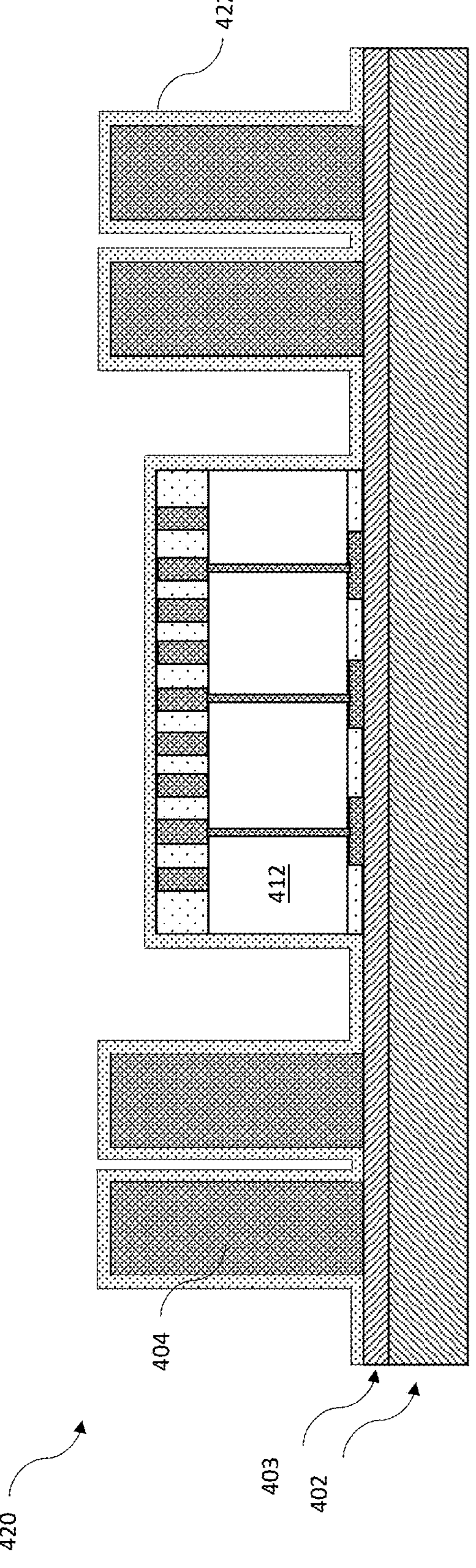

FIG. 4C illustrates an assembly 420 after a liner 422 is deposited on surfaces of assembly 410 (FIG. 4B). In particular, liner 422 is deposited on top and side surfaces of pillars 404 and IC structure 412 and portions of exposed surfaces of support surface 403. In certain embodiments, prior to deposition of material comprising liner 422, one or more etch processes are performed on assembly 410 to prepare the surfaces on which liner 422 is to be deposited. A first etch process (or set of etch processes) includes seed metal etching comprising one or more wet chemistry etches to remove seed copper or seed copper-titanium used to pattern the pillars 404. A second etch process performed after the first etch process includes a wet chemical etch process for roughening the surfaces of pillars 404 to promote mechanical adhesion of the liner material to the copper pillar surfaces. In some embodiments, the second etch process may include a soft inductively coupled plasma (ICP) etch or the like. In accordance with features of embodiments described herein, deposition of SiN film is performed at a low temperature (e.g., less than 250 degrees Celsius, which is the maximum allowed temperature for many assembled components of assembly 410). In one embodiment, deposition is performed using a physical vapor deposition (PVD) method where SiN deposition is undertaken using repeated cycles of heated deposition followed by cooling along with a continuous ramp in deposition temperature Alternatively, deposition of the SiN film may be performed using plasma-enhanced chemical vapor deposition (PECVD) and/or other known deposition methods. In certain embodiments, the deposited film is between 100 nanometer and 1 micrometer. When PVD is used to deposit the SiN film, some hydrogen and/or oxygen may be observed in the liner in low quantities. When PECVD is used to deposit the SiN film, hydrogen and/or oxygen at higher quantities than when PVD is used may be observed in the liner.

Figure 4D:
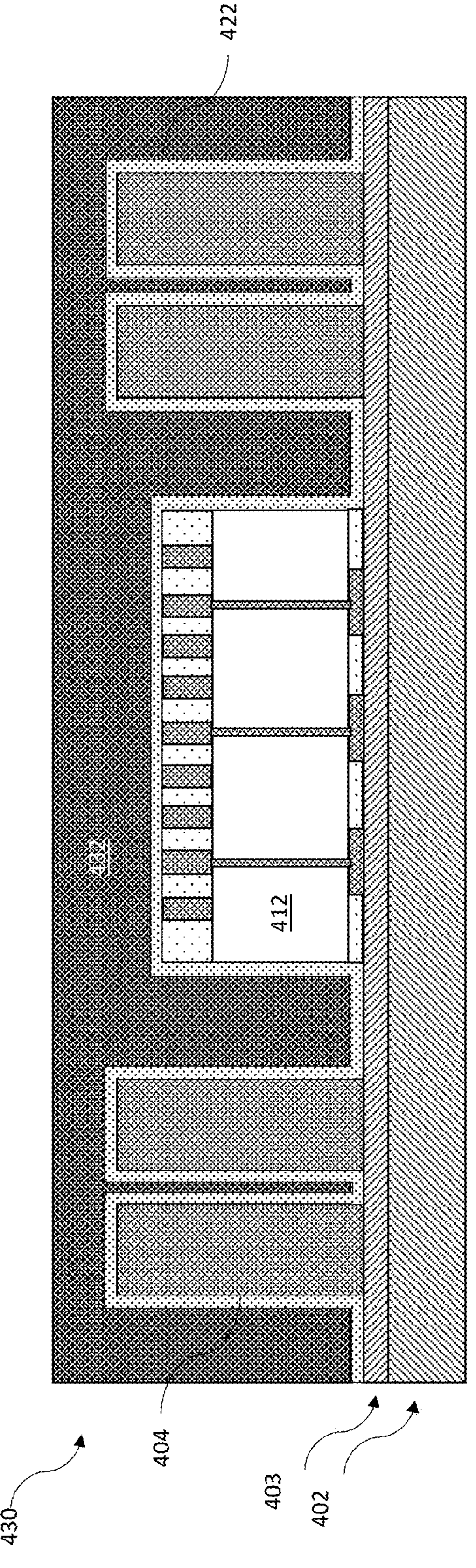

FIG. 4D illustrates an assembly 430 after mold material 432 is deposited on surfaces of assembly 420 (FIG. 4C). As shown in FIG. 4D, liner 422 is at interfaces between pillars 404 and mold material 432 as well as IC structure 412 and mold material to promote adhesion of mold material 432 to pillars 404 and IC structure 412.

Figure 4E:
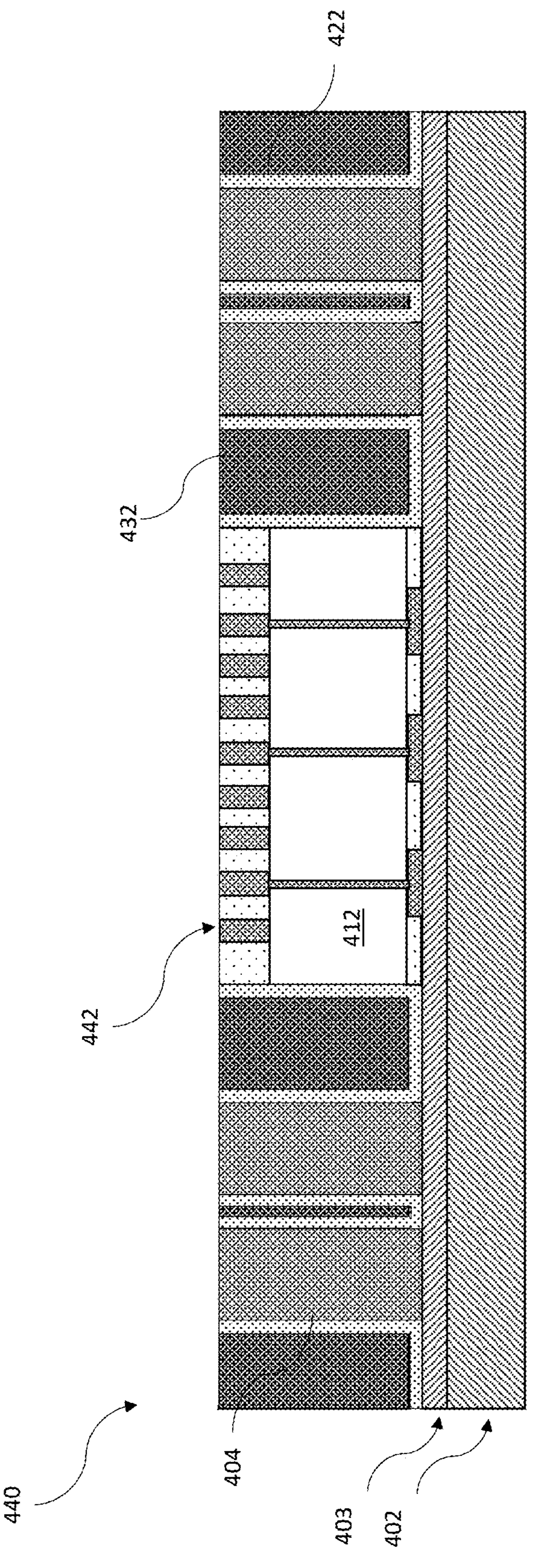

FIG. 4E illustrates an assembly 440 after a top surface of assembly 430 has been planarized to remove excess mold material 432 and to expose tops of pillars 404 and tops of vias 442 comprising DTD interconnect structures provided over IC structure 412.

FIGS. 5A-5E are schematic cross-sectional illustrations of various stages in an example process for fabricating a base complex of an example IC package, such as package 200, according to some embodiments of the present disclosure. Although FIGS. 5A-5E illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 5A-5E may be modified in accordance with the present disclosure to fabricate other embodiments and/or components of package 200 as disclosed herein.

Figure 5A:
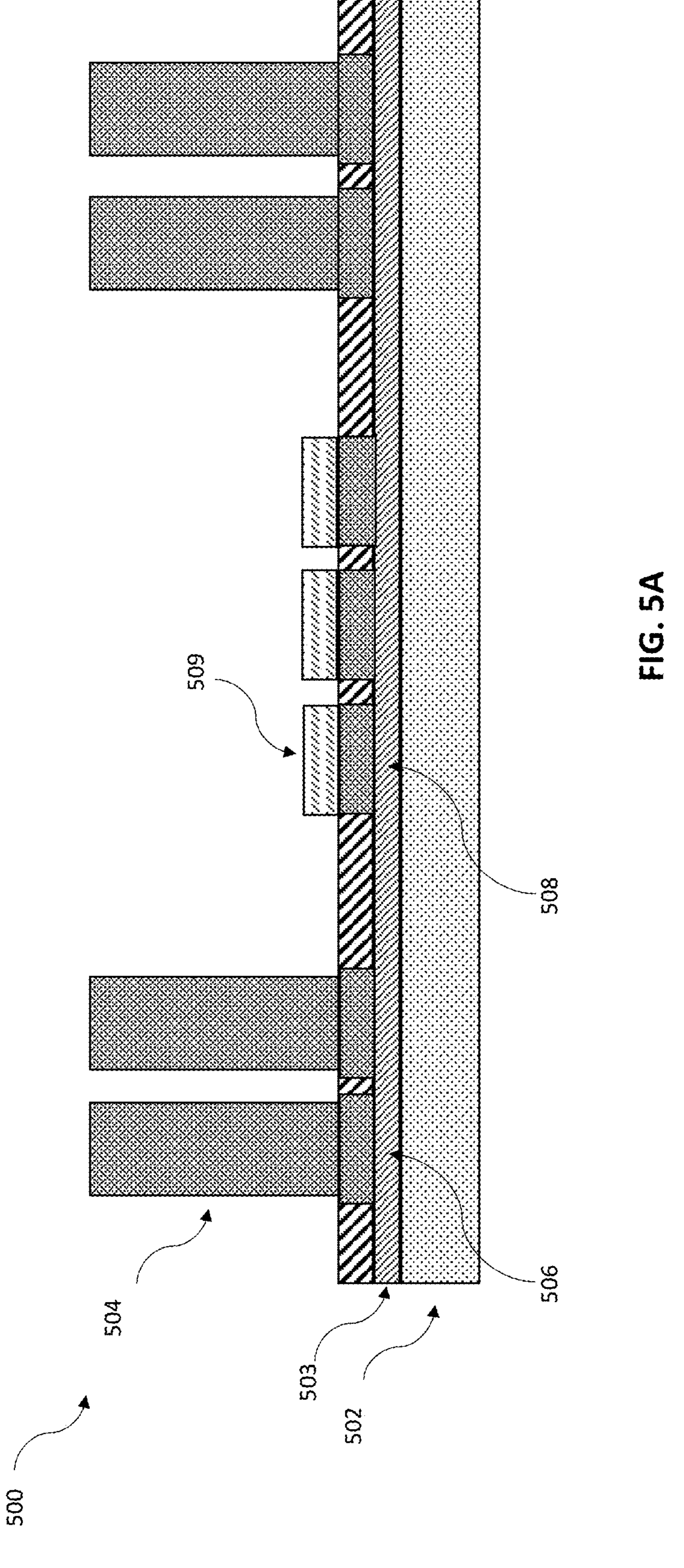
FIGS. 5A-5E are schematic cross-sectional illustrations of various stages in an example process for fabricating the base complex of the example IC package of FIG. 2, according to some embodiments of the present disclosure.

FIG. 5A illustrates a microelectronics assembly 500 (alternatively referred to herein as simply "assembly") including a carrier 502 and a base complex package support surface that has been plated or otherwise deposited with conductive material, such as copper, to generate traces (not shown), planes (not shown), pillars 504, and DTPS interconnect structures 506, 508. In certain embodiments, package support surface 503 includes a release layer and/or multiple layers of patterned metal and dielectric circuitry. Release layer may include any material, including organic material, enabling release of the base complex from the carrier 502 later in the process and may include a laser release film, a thermal release film and/or a mechanical release/peel layer. Any suitable manufacturing technique (such as additive, subtractive, semi-additive, etc.) may be used to manufacture assembly 500 as shown in FIG. 5A. In various embodiments, the metallization may be formed using any known process in the art, including electroplating, photolithography, etc. In various embodiments, carrier 502 may comprise a semiconductor material. In some embodiments, carrier 502 may comprise any rigid, non-conductive material, such as alumina, that can provide mechanical support to the deposited metallization. In various embodiments, the metallization may comprise copper; in some embodiments, the metallization may comprise aluminum; in some embodiments, the metallization may comprise metal alloys of various compositions. Additionally, although pillars 504 are shown as being arranged in pairs, it will be recognized that pillars may be positioned in various locations on support surface 503 over carrier 502 with respect to other elements thereon without departing from the spirit or scope of embodiments described herein. Solder 509 is provided on interconnect structures 508.

Figure 5B:
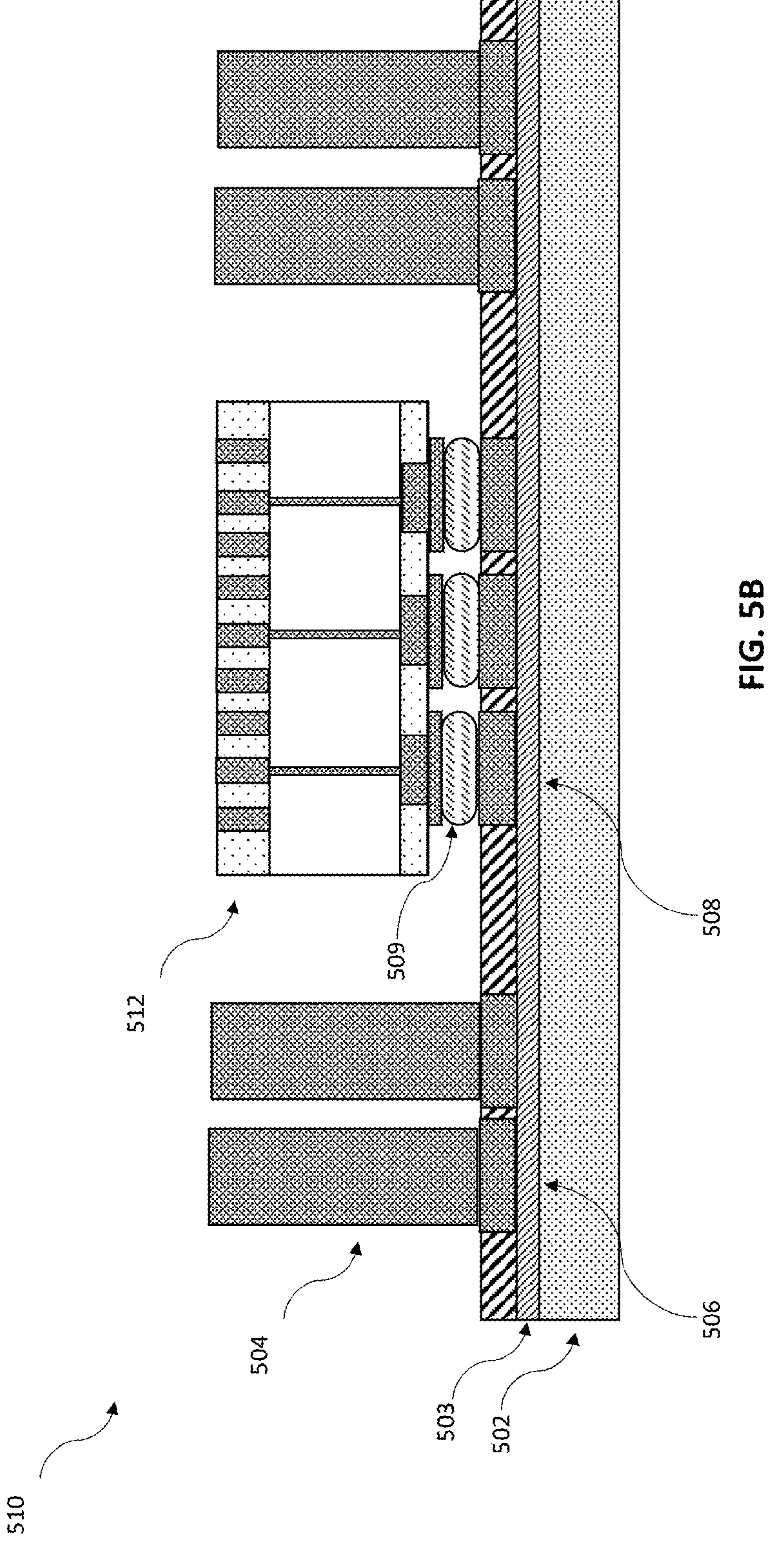

FIG. 5B illustrates an assembly 510 that includes assembly 500 (FIG. 5A) to which an IC structure 512 has been attached to support surface 503 over the carrier 502. Although IC structure 512 is shown as being positioned between pillars 504, it will be recognized that die may be positioned in various locations over carrier 502 with respect to pillars without departing from the spirit or scope of embodiments described herein. As illustrated in FIG. 5B, DTPS interconnect structures 514 provided on IC structure 512 are attached to support surface 503 by solder 509 on interconnect structures 508.

Figure 5C:
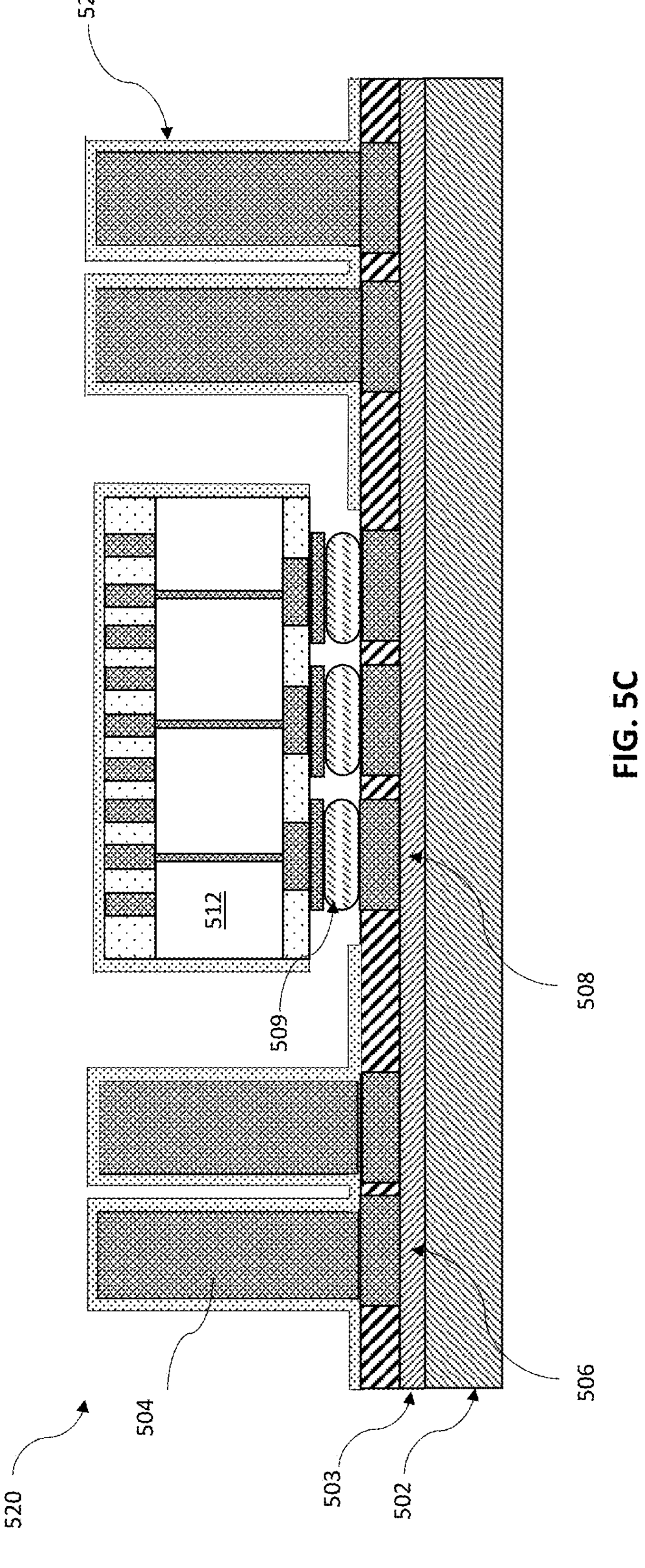

FIG. 5C illustrates an assembly 520 after a liner 522 is deposited on surfaces of assembly 510 (FIG. 5B). In particular, liner 522 is deposited on top and side surfaces of pillars 504 and IC structure 512 and portions of exposed surfaces of support surface 503. In certain embodiments, prior to deposition of material comprising liner 522, one or more etch processes are performed on assembly 410 to prepare the surfaces on which liner 522 is to be deposited. A first etch process (or set of etch processes) includes seed metal etching comprising one or more wet chemistry etches to remove seed copper or seed copper-titanium used to pattern the pillars 504. A second etch process performed after the first etch process includes a wet chemical etch process for roughening the surfaces of pillars 504 to promote mechanical adhesion of the liner material to the copper pillar surfaces. In some embodiments, the second etch process may include a soft ICP etch or the like. In accordance with features of embodiments described herein, deposition of SiN film is performed at a low temperature (e.g., less than 250 degrees Celsius, which is the maximum allowed temperature for many assembled components of assembly 510). In one embodiment, deposition is performed using a PVD method. Alternatively, deposition of the SiN film may be performed using PECVD and/or other known deposition methods. In certain embodiments, the deposited film is between 100 nanometer and 1 micrometer. When PVD is used to deposit the SiN film, some hydrogen and/or oxygen may be observed in the liner in low quantities. When PECVD is used to deposit the SiN film, hydrogen and/or oxygen at higher quantities than when PVD is used may be observed in the liner.

Figure 5D:
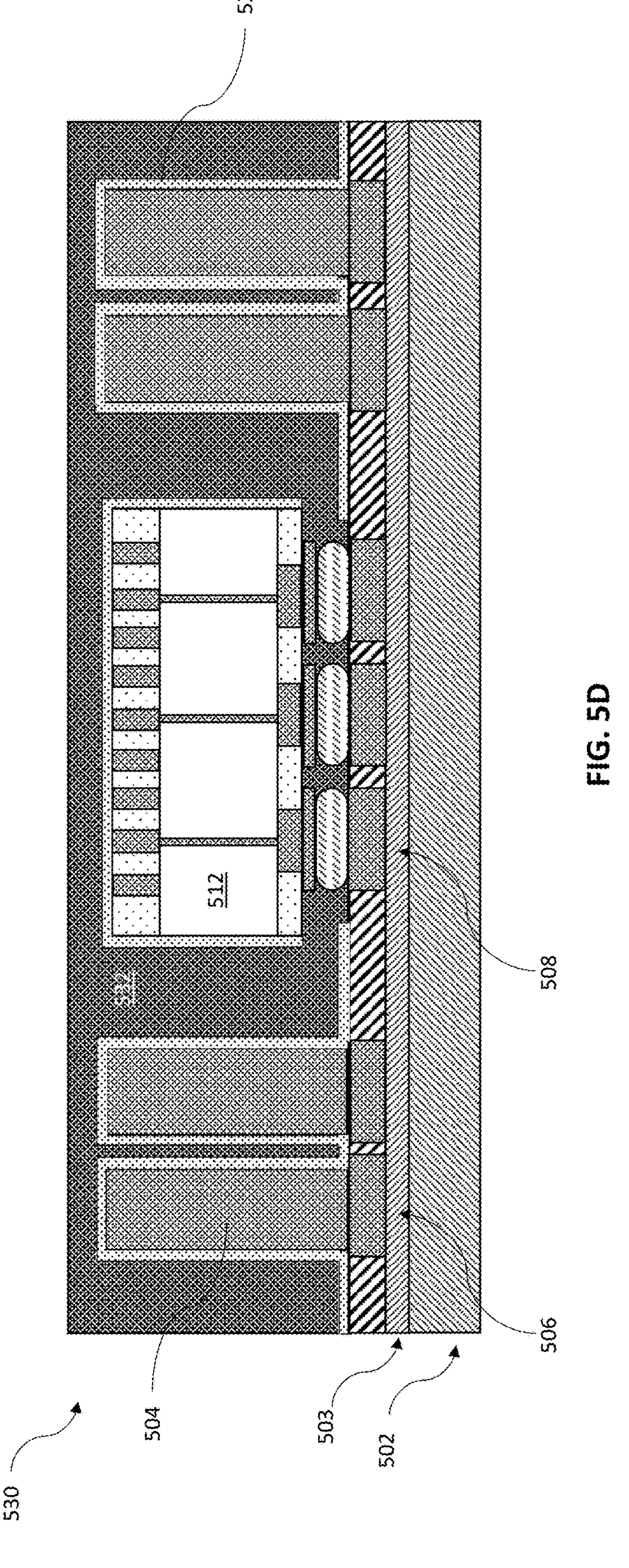

FIG. 5D illustrates an assembly 530 after mold material 532 is deposited on surfaces of assembly 520 (FIG. 5C). As shown in FIG. 5D, liner 522 is at interfaces between pillars 504 and mold material 532 as well as IC structure 512 and mold material to promote adhesion of mold material 532 to pillars 504 and IC structure 512.

Figure 5E:
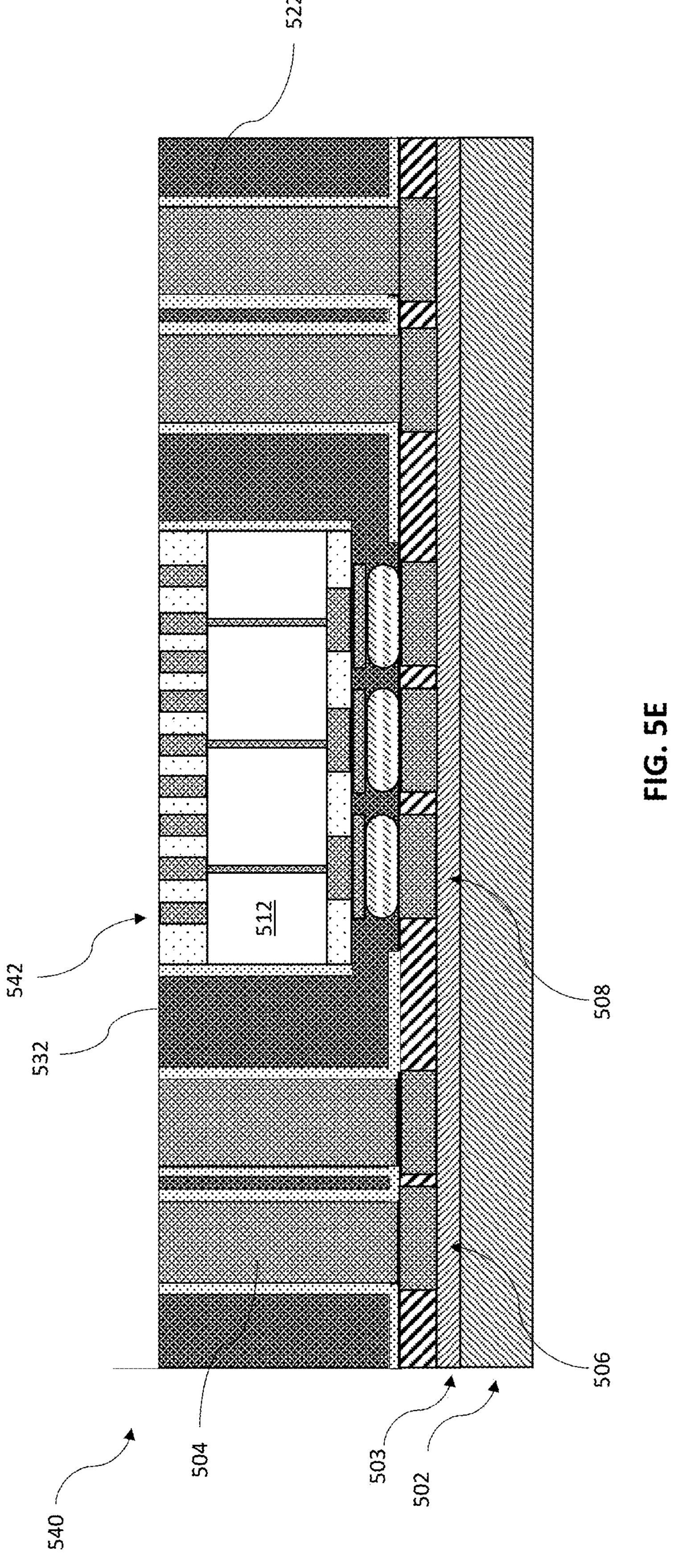

FIG. 5E illustrates an assembly 540 after a top surface of assembly 530 has been planarized to remove excess mold material 532 and to expose tops of pillars 504 and tops of vias 542 comprising DTD interconnect structures provided over IC structure 512.

FIGS. 6A-6E are schematic cross-sectional illustrations of various stages in an example process for fabricating a base complex of an example IC package, such as package 300, according to some embodiments of the present disclosure. Although FIGS. 6A-6E illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 6A-6E may be modified in accordance with the present disclosure to fabricate other embodiments and/or components of package 300 as disclosed herein.

Figure 6A:
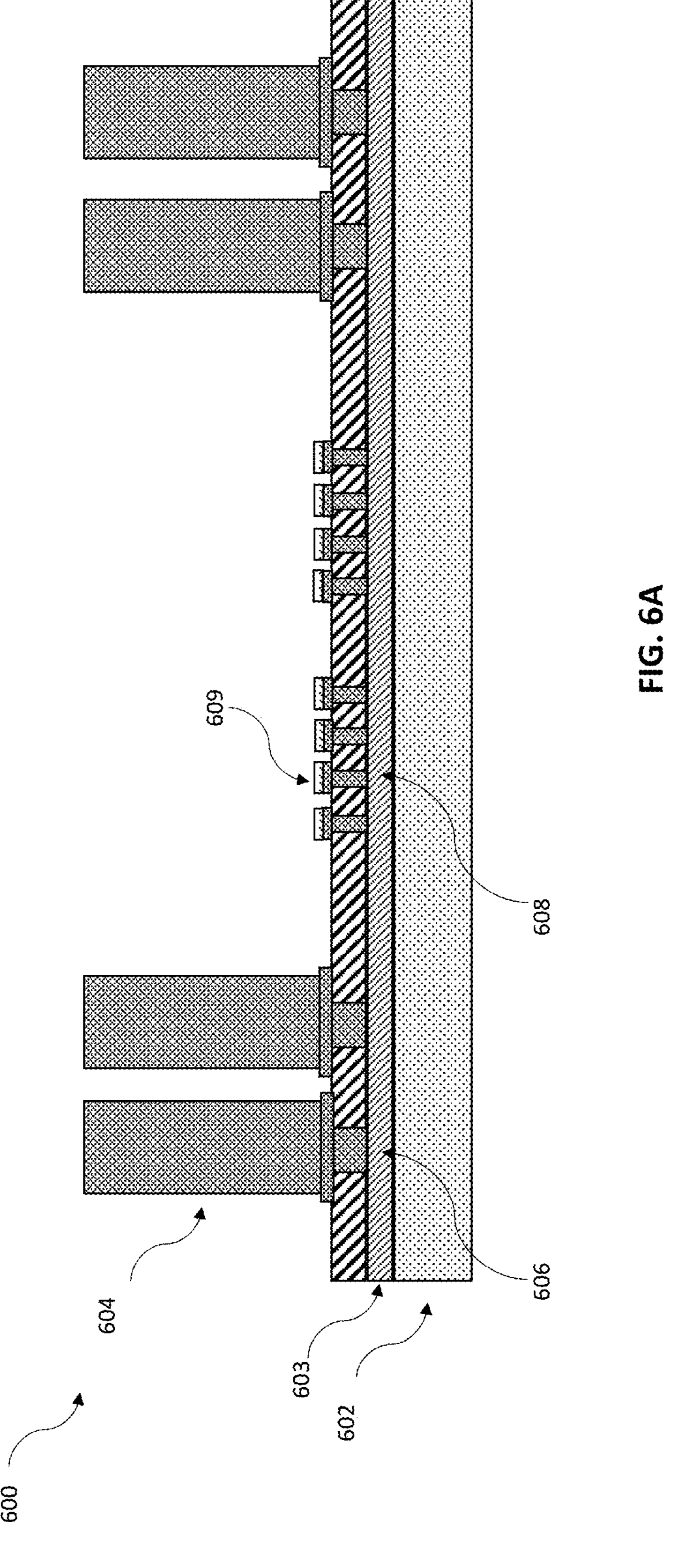
FIGS. 6A-6E are schematic cross-sectional illustrations of various stages in an example process for fabricating the base complex of the example IC package of FIG. 3, according to some embodiments of the present disclosure.

FIG. 6A illustrates a microelectronics assembly 600 (alternatively referred to herein as simply "assembly") including a carrier 602 and a base complex package support surface 603 that has been plated or otherwise deposited with conductive material, such as copper, to generate traces (not shown), planes (not shown), pillars 604, and DTD interconnect structures 606, 608. In certain embodiments, package support surface 603 includes a release layer and/or multiple layers of patterned metal and dielectric circuitry. Release layer may include any material, including organic material, enabling release of the base complex from the carrier 602 later in the process and may include a laser release film, a thermal release film and/or a mechanical release/peel layer. Any suitable manufacturing technique (such as additive, subtractive, semi-additive, etc.) may be used to manufacture assembly 600 as shown in FIG. 6A. In various embodiments, the metallization may be formed using any known process in the art, including electroplating, photolithography, etc. In various embodiments, carrier 602 may comprise a semiconductor material. In some embodiments, carrier 602 may comprise any rigid, non-conductive material, such as alumina, that can provide mechanical support to the deposited metallization. In various embodiments, the metallization may comprise copper; in some embodiments, the metallization may comprise aluminum; in some embodiments, the metallization may comprise metal alloys of various compositions. Additionally, although pillars 604 are shown as being arranged in pairs, it will be recognized that pillars may be positioned in various locations on support surface 603 over carrier 602 with respect to other elements thereon without departing from the spirit or scope of embodiments described herein. Solder 609 is provided on interconnect structures 608.

Figure 6B:
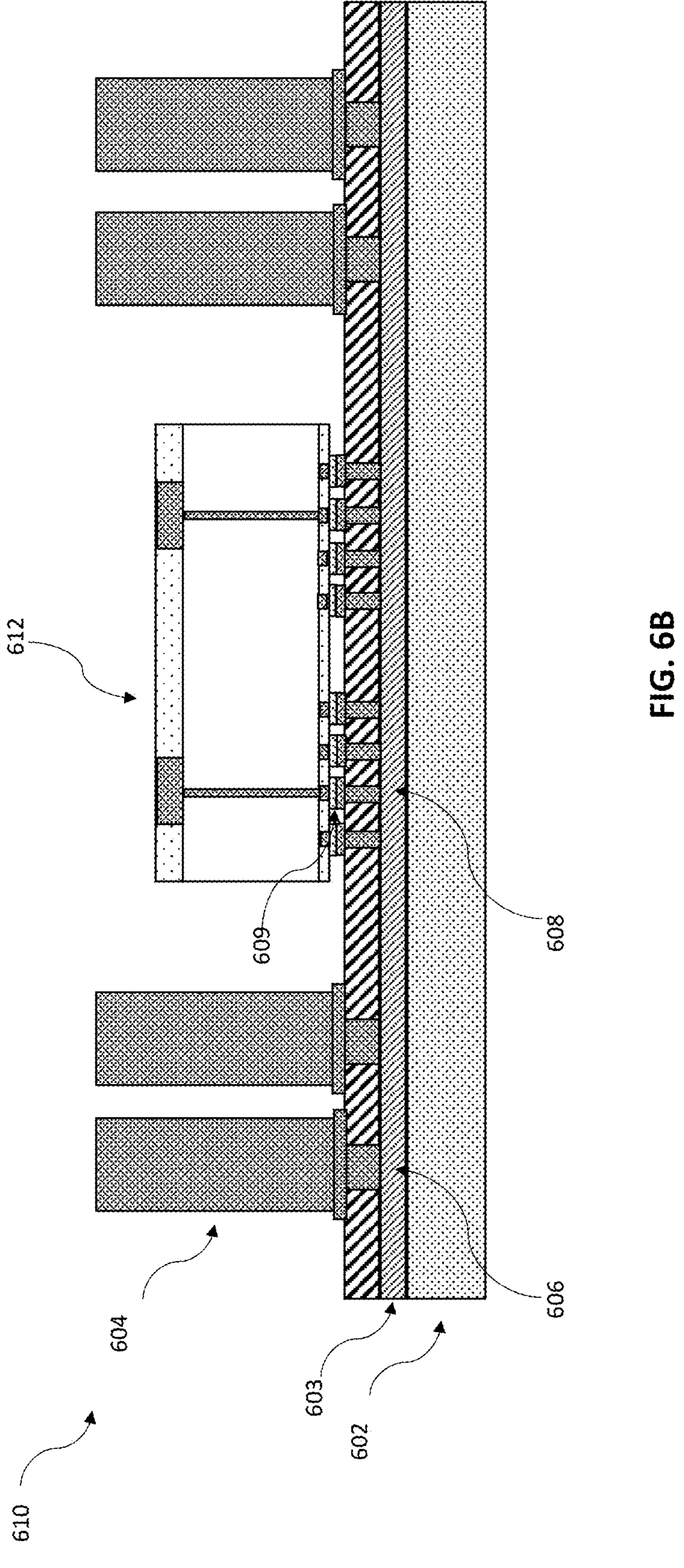

FIG. 6B illustrates an assembly 610 that includes assembly 600 (FIG. 6A) to which an IC structure 612 has been attached to support surface 603 over carrier 602. Although IC structure 612 is shown as being positioned between pillars 604, it will be recognized that die may be positioned in various locations on carrier 602 with respect to pillars without departing from the spirit or scope of embodiments described herein. As illustrated in FIG. 6B, DTD interconnect structures 614 provided on IC structure 612 are attached to interconnect structures 608 on support surface 603 with solder 609.

Figure 6C:
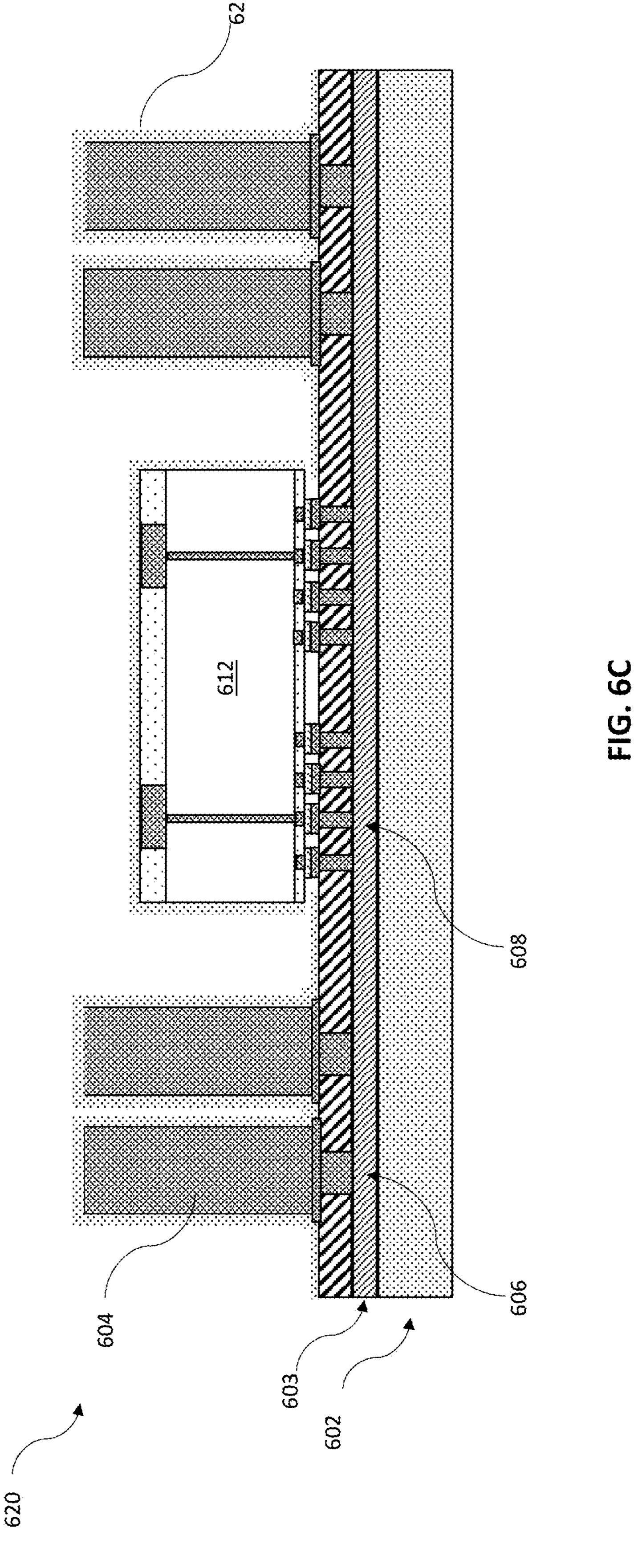

FIG. 6C illustrates an assembly 620 after a liner 622 is deposited on surfaces of assembly 610 (FIG. 6B). In particular, liner 622 is deposited on top and side surfaces of pillars 604 and IC structure 612 and portions of exposed surfaces of support surface 603. In certain embodiments, prior to deposition of material comprising liner 622, one or more etch processes are performed on assembly 410 to prepare the surfaces on which liner 622 is to be deposited. A first etch process (or set of etch processes) includes seed metal etching comprising one or more wet chemistry etches to remove seed copper or seed copper-titanium used to pattern the pillars 604. A second etch process performed after the first etch process includes a wet chemical etch process for roughening the surfaces of pillars 604 to promote mechanical adhesion of the liner material to the copper pillar surfaces. In some embodiments, the second etch process may include a soft ICP etch or the like. In accordance with features of embodiments described herein, deposition of SiN film is performed at a low temperature (e.g., less than 260 degrees Celsius, which is the maximum allowed temperature for many assembled components of assembly 610). In one embodiment, deposition is performed using a PVD method. Alternatively, deposition of the SiN film may be performed using PECVD and/or other known deposition methods. In certain embodiments, the deposited film is between 100 nanometer and 1 micrometer. When PVD is used to deposit the SiN film, some hydrogen and/or oxygen may be observed in the liner in low quantities. When PECVD is used to deposit the SiN film, hydrogen and/or oxygen at higher quantities than when PVD is used may be observed in the liner.

Figure 6D:
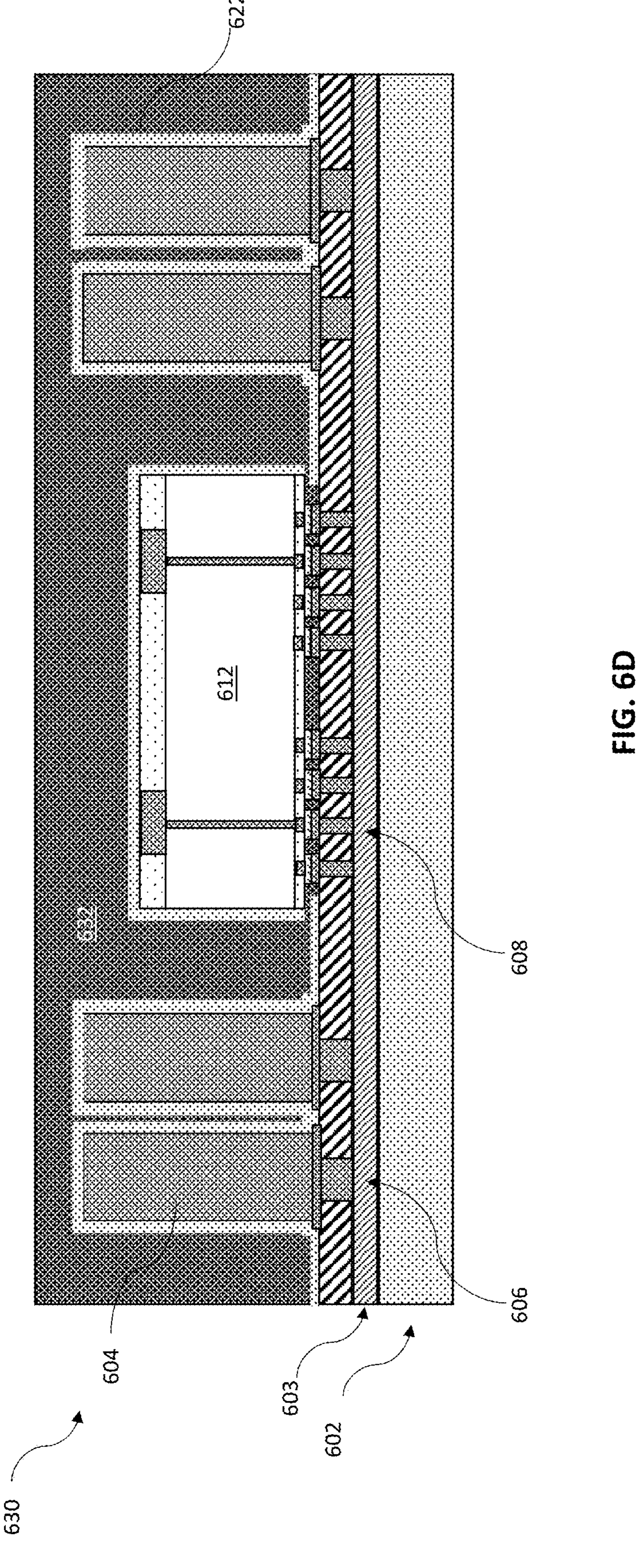

FIG. 6D illustrates an assembly 630 after mold material 632 is deposited on surfaces of assembly 620 (FIG. 6C). As shown in FIG. 6D, liner 622 is at interfaces between pillars 604 and mold material 632 as well as IC structure 612 and mold material to promote adhesion of mold material 632 to pillars 604 and IC structure 612.

Figure 6E:
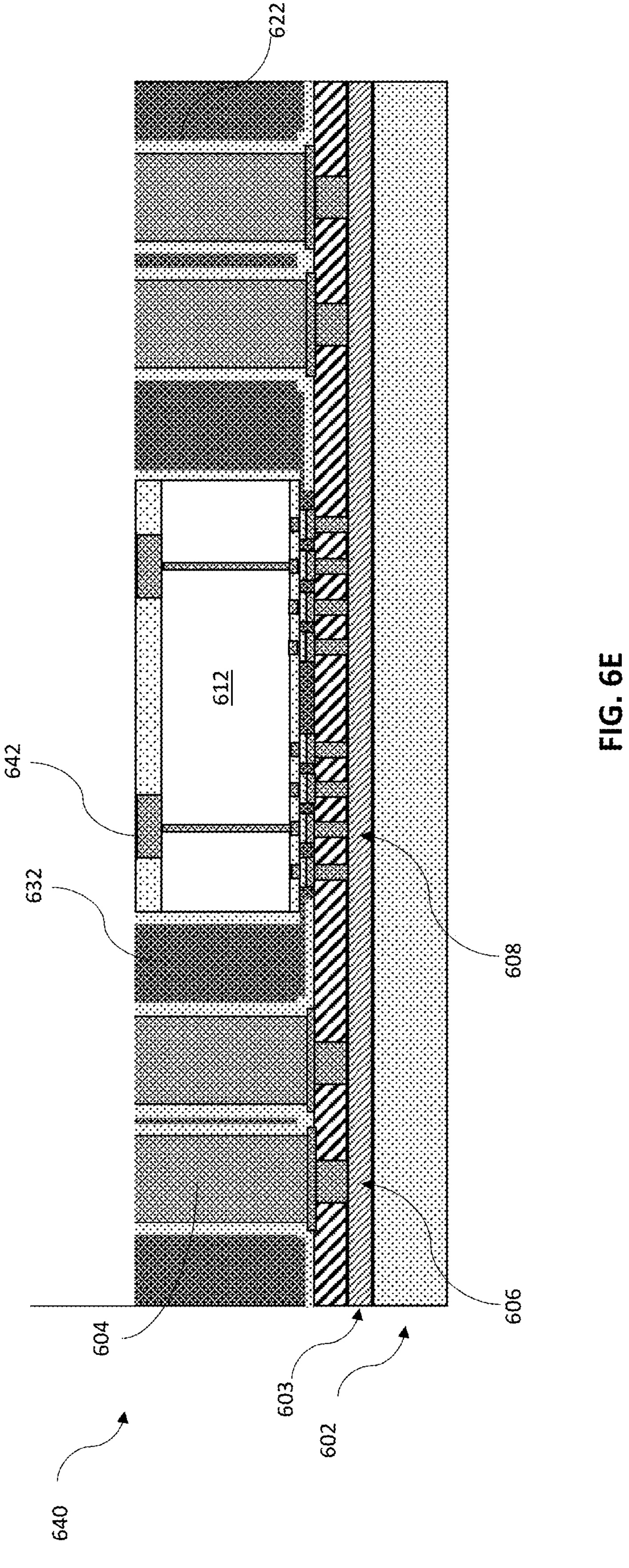

FIG. 6E illustrates an assembly 640 after a top surface of assembly 630 has been planarized to remove excess mold material 632 and to expose tops of pillars 604 and tops of vias 642 comprising DTPS interconnect structures provided on IC structure 612.

Various types of devices and/or packages may be manufactured using techniques as described herein. In some implementations, a choice of fabrication processes or other techniques may depend on how dies are coupled (e.g., using a flip-chip arrangement, or using some other arrangement). In another example, in some implementations, a choice of a technique may depend on the size, arrangement, and/or identity of the device or devices. In yet other examples, a choice of technique may depend on ease of processing and availability of various materials.

Figure 7:
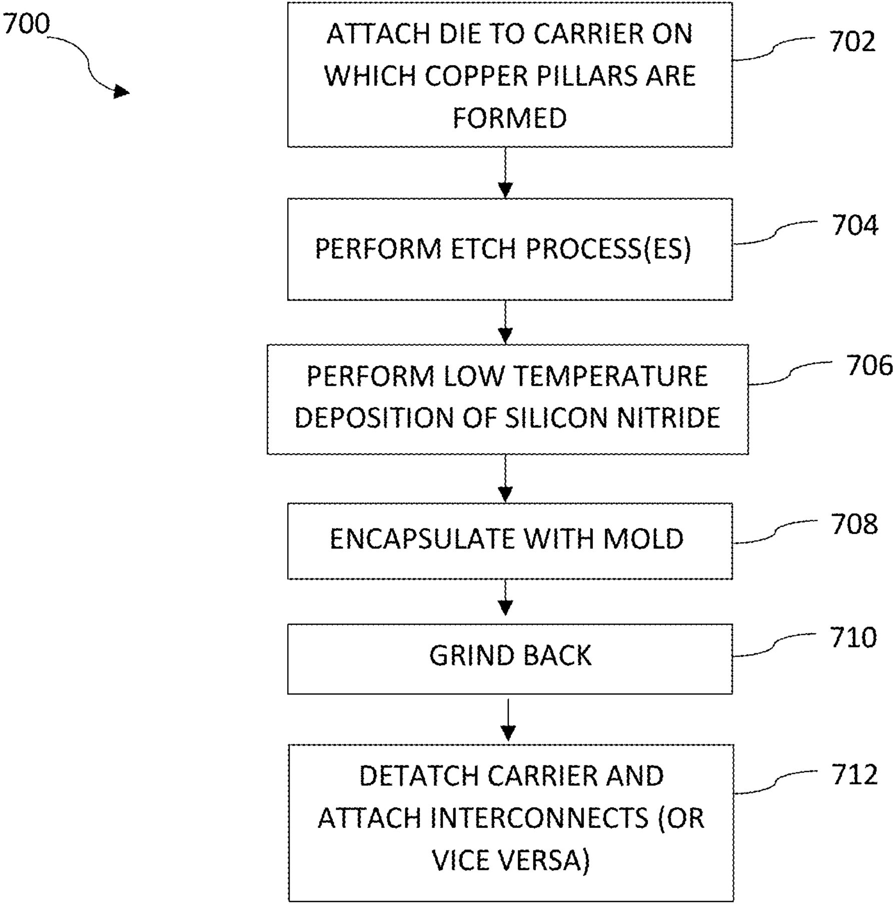
FIG. 7 is a flow diagram of an example method of fabricating a base complex including copper pillar and first level die liners, according to some embodiments of the present disclosure.

FIG. 7 is a flow diagram of an example method 700 of fabricating a base complex including copper pillar and first level die liners, according to various embodiments of the present disclosure.

At 702, a die is attached to a carrier on which copper pillars have been formed. Interconnect structures may also be formed on the carrier. It will be recognized that the copper pillars and interconnect structures may be formed using one or more of any number of conventional processes for forming conductive structures on a carrier. In certain embodiments, the carrier may be a carrier wafer (i.e., a circular carrier), while in other embodiments, the carrier may be a panel carrier (i.e., a rectangular carrier). The die may be attached to the carrier using one or more of any number of processes for attaching a die to a carrier, such as illustrated in one or more of FIGS. 4A-4E, 5A-5E, and 6A-6E. The relative locations and positions of copper pillar and die on the carrier may be dictated by any number of different considerations, including an intended application of the base complex being constructed At 704, one or more etch processes are performed on the assembly. For example, a first etch process (or set of etch processes) may include seed metal etching comprising one or more wet chemistry etches to remove seed copper or seed copper-titanium used to pattern the pillars. A second etch process performed after the first etch process may include a wet chemical etch process for roughening the surfaces of pillars to promote mechanical adhesion of the liner material to the copper pillar surfaces. In some embodiments, the second etch process may include a soft ICP etch or the like.

At 706, deposition of a SiN film is performed at a low temperature (e.g., less than 250 degrees Celsius, which is the maximum allowed temperature for many assembled components of a microelectronic assembly). In one embodiment, deposition is performed using a PVD method. Alternatively, deposition of the SiN film may be performed using PECVD and/or other known deposition methods. In certain embodiments, the deposited film is between 100 nanometer and 1 micrometer. When PVD is used to deposit the SiN film, some hydrogen and/or oxygen may be observed in the liner in low quantities. When PECVD is used to deposit the SiN film, hydrogen and/or oxygen at higher quantities than when PVD is used may be observed in the liner.

At 708, the assembly is encapsulated with a mold material, with the SiN film deposited in 706 serving as a liner between surfaces of the copper pillars and die on which the film has been deposited and the mold material.

At 710, after the mold material encapsulated assembly has been cured, the surface of the assembly is ground back (e.g., using a CMP process) to expose the copper pillars and/or conductive structures on a top surface of the die.

At 712, interconnects comprising conductive bumps are formed on a top surface of the assembly and the assembly is detached from the carrier. Alternatively, the assembly may be detached from the carrier before the interconnects are formed. In certain embodiments (e.g., as illustrated in FIGS. 4A-4E and 5A-5E), the conductive bumps comprise DTD interconnect structures. In other embodiments (e.g., as illustrated in FIGS. 6A-6E), the conductive bumps comprise DTPS interconnect structures.

Although the operations of the method 700 are illustrated in FIG. 7 once each and in a particular order, the operations may be performed in any suitable order and repeated as desired. For example, one or more operations may be performed in parallel to manufacture multiple devices and/or packages substantially simultaneously. In another example, the operations may be performed in a different order to reflect the structure of a particular package in connection with which the method 500 is implemented.

Furthermore, the operations illustrated in FIG. 7 may be combined or may include more details than described. Still further, method 700 shown in FIG. 7 may further include other manufacturing operations related to fabrication of other components of packages in connection with which the method 700 is implemented. For example, method 700 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Example Devices and Components

Figure 8:
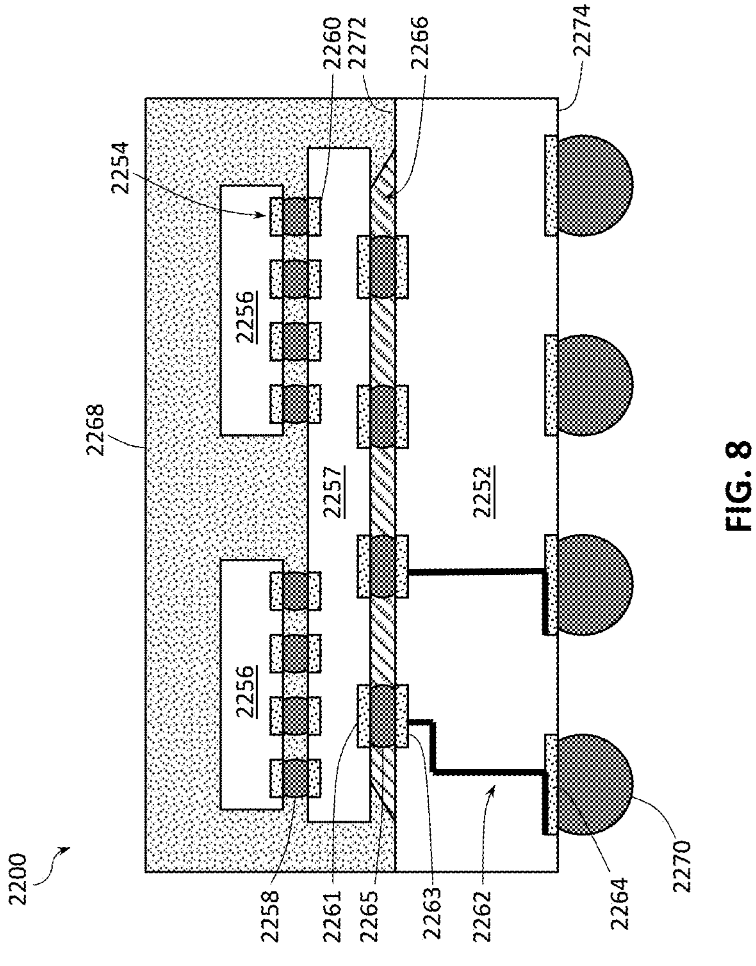
FIG. 8 is a cross-sectional view of a device package that may include one or more components, according to some embodiments of the present disclosure.
Figure 9:
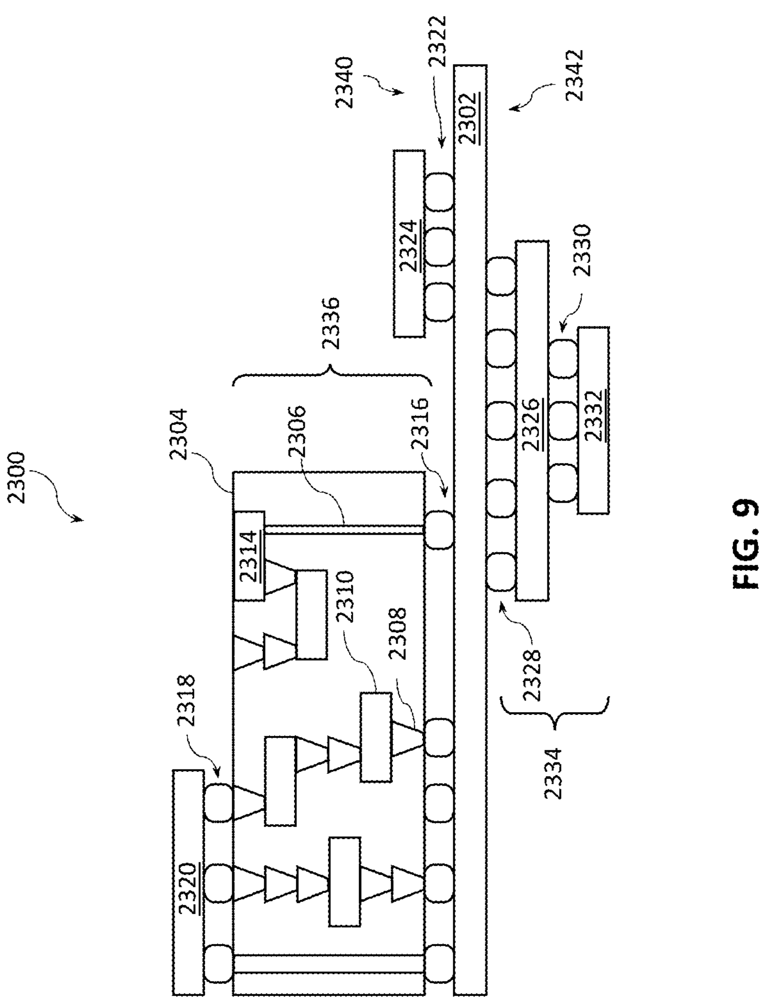
FIG. 9 is a cross-sectional side view of a device assembly that may include one or more components, according to some embodiments of the present disclosure.
Figure 10:
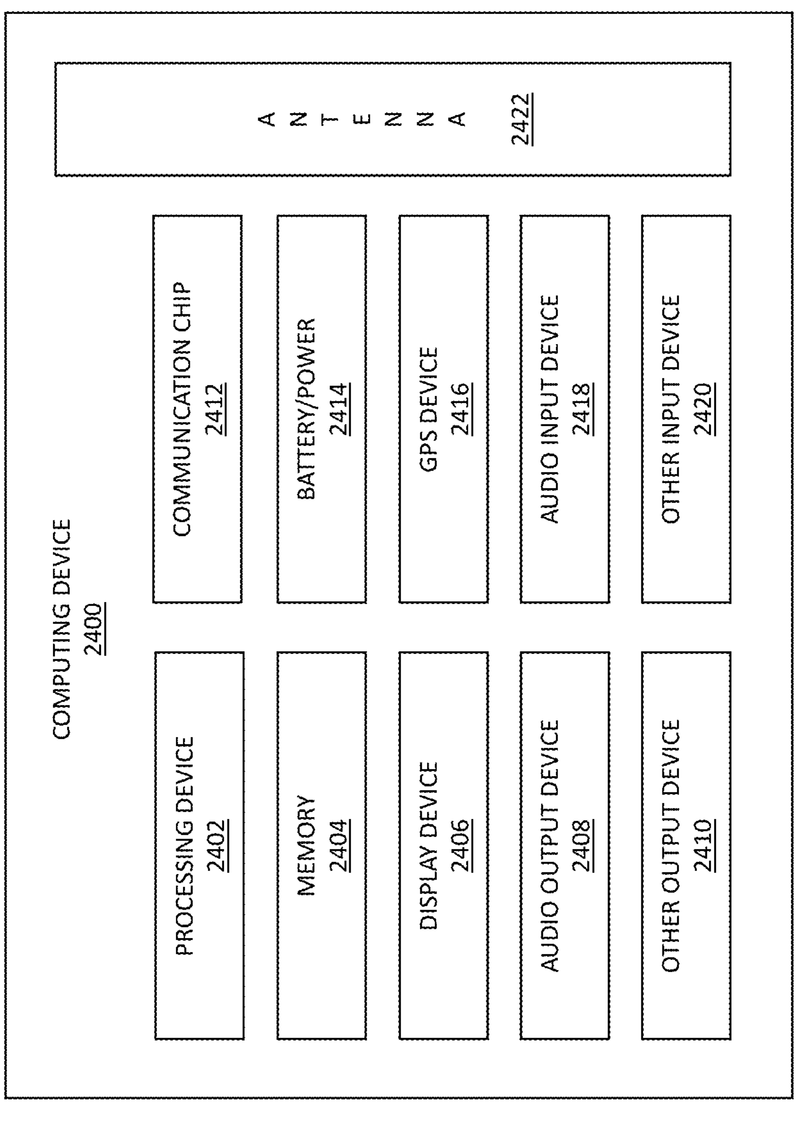
FIG. 10 is a block diagram of an example computing device that may include one or more components, according to some embodiments of the present disclosure.

The package components disclosed herein, e.g., any of the embodiments shown in the figures or any further embodiments described herein, may be included in any suitable component. FIGS. 8-10 illustrate various examples of packages, assemblies, and devices that may be used with or include any of the package components as disclosed herein.

FIG. 8 is a side, cross-sectional view of an example IC package 2200 that may include package components in accordance with any of the embodiments disclosed herein. In some embodiments, the IC package 2200 may be a system-in-package (SiP).

As shown in FIG. 8, package support 2252 may be formed of an insulating material (e.g., a ceramic, a build-up film, an epoxy film having filler particles therein, etc.), and may have conductive pathways extending through the insulating material between first face 2272 and second face 2274, or between different locations on first face 2272, and/or between different locations on second face 2274. These conductive pathways may take the form of any of the interconnect structures comprising lines and/or vias, e.g., as discussed above with reference to the figures.

Package support 2252 may include conductive contacts 2263 that are coupled to conductive pathways 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first level interconnects 2265, and conductive contacts 2263 of package support 2252. First level interconnects 2265 illustrated in FIG. 8 are solder bumps, but any suitable first level interconnects 2265 may be used, such as solder bumps, solder posts, or bond wires.

IC package 2200 may include one or more dies 2256 coupled to interposer 2257 via conductive contacts 2254 of dies 2256, first level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First level interconnects 2258 illustrated in FIG. 8 are solder bumps, but any suitable first level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second level interconnects 2270 may be coupled to conductive contacts 2264. Second level interconnects 2270 illustrated in FIG. 8 are solder balls (e.g., for a BGA arrangement), but any suitable second level interconnects 2270 may be used (e.g., pins in a pin grid array arrangement or lands in a land grid array arrangement). Second level interconnects 2270 may be used to couple IC package 2200 to another component, such as a circuit board (e.g., a motherboard), an interposer, or another IC package, as known in the art and as discussed below with reference to FIG. 9.

In embodiments in which IC package 2200 includes multiple dies 2256, IC package 2200 may be referred to as a multi-chip package (MCP). Dies 2256 may include circuitry to perform any desired functionality. For example, one or more of dies 2256 may be logic dies (e.g., silicon-based dies), one or more of dies 2256 may be memory dies (e.g., high bandwidth memory), etc.

Although IC package 2200 illustrated in FIG. 8 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first level interconnects 2265.

FIG. 9 is a cross-sectional side view of an IC device assembly 2300 that may include components having one or more package components 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more package components 100 in accordance with any of the embodiments disclosed herein; e.g., any of the IC packages discussed below with reference to IC device assembly 2300 may take the form of any of the embodiments of IC package 2200 discussed above with reference to FIG. 8.

In some embodiments, circuit board 2302 may be a printed circuit board (PCB) including multiple metal layers separated from one another by layers of insulating material and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 9 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 8. In some embodiments, IC package 2320 may include at least one package component 100 as described herein. Package component 100 is not specifically shown in FIG. 9 in order to not clutter the drawing.

Although a single IC package 2320 is shown in FIG. 9, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 9, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304, for example, as shown in FIGS. 1-3.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 10 is a block diagram of an example computing device 2400 that may include one or more package components in accordance with any of the embodiments disclosed herein. For example, any one or more of the components of computing device 2400 may include any embodiments of IC package 2200 (e.g., as shown in FIG. 8). In yet another example, any one or more of the components of computing device 2400 may include an IC device assembly 2300 (e.g., as shown in FIG. 9).

A number of components are illustrated in FIG. 10 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 10, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408 but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term “processing device” or “processor” may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term “wireless” and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as “3GPP2”), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides an IC package, including a conductive structure; a mold material at least partially encasing the conductive structure; and a liner on a surface of the IC component between the surface of the conductive structure and the mold material, where the liner includes a material including silicon and nitrogen.

Example 2 provides the IC package of example 1, where the conductive structure includes a pillar that incudes copper.

Example 3 provides the IC package of any of examples 1-2, where the conductive structure is connected to a support surface.

Example 4 provides the IC package of example 3, where the liner includes a first liner, the IC package further including a second liner on at least a portion of the support surface.

Example 5 provides the IC package of example 4, where the second liner includes a material including silicon and nitrogen.

Example 6 provides the IC package of example 3, further including an IC die proximate the conductive structure and connected to the support surface, the IC die having a first face facing the support surface, a second face opposite the first face, and at least one side extending between the first face and the second face.

Example 7 provides the IC package of example 6, where the liner includes a first liner, the IC package further including a second liner on the at least one side of the IC die between the at least one side of the IC die and the mold material.

Example 8 provides the IC package of example 7, where the second liner includes a material including silicon and nitrogen.

Example 9 provides the IC package of example 6, where the liner includes a first liner, the IC package further including mold material on at least a portion of the first face of the IC die and a second liner on at least a portion of the support surface between the mold material on the portion of the first face of the IC die and the at least apportion of the support surface.

Example 10 provides the IC package of example 9, where the second liner includes a material including silicon and nitrogen.

Example 11 provides the IC package of any of examples 1-2, where the conductive structure includes a pillar that includes copper.

Example 12 provides the IC package of any of examples 1-2, where the conductive structure includes a plurality of conductive structures.

Example 13 provides the IC package of example 12, where the plurality of conductive structures include pillars that include copper.

Example 14 provides the IC package of any of examples 1-2, where a thickness of the liner is between about 100 nanometer and 1 micrometer.

Example 15 provides the IC package of any of examples 1-2, where the liner includes silicon and nitrogen in a ratio of about 3 to 4.

Example 16 provides the IC package of example 3, where the support surface is over a package support.

Example 17 provide the IC package of example 16, where the IC structure is between the package support and the support surface.

Example 18 provides the IC package of example 16, where the support surface is between the package support and the IC structure.

Example 19 provides the IC package of example 3, further including a carrier structure, where the support surface is between the carrier structure and the IC structure.

Example 20 provides a microelectronic assembly, including a conductive structure including a pillar that includes copper; an IC die proximate the conductive structure, the IC die including first and second opposing faces and a plurality of sides extending between the first and second faces; a mold material encasing at least a portion of the IC component and the conductive structure; a first liner on a surface of the conductive structure between the surface of the conductive structure and the mold material; and a second liner on the plurality of sides of the IC die between the sides of the IC die and the mold material, where the first and second liners include a material including silicon and nitrogen.

Example 21 provides the microelectronic assembly of example 20, where the IC die includes a first IC die, the microelectronic assembly further including a package support and a second IC die electrically coupled to at the first IC die.

Example 22 provides the microelectronic assembly of example 21, where at least a portion of the first IC die is between the package support and the second IC die.

Example 23 provides the microelectronic assembly of example 20, where the IC die includes a first IC die, the microelectronic assembly further including a package support and a second IC die electrically coupled to the conductive structure.

Example 24 provides the microelectronic assembly of example 23, where at least apportion of the conductive structure is between the package support and the second IC die.

Example 25 provides the microelectronic assembly of any of examples 20-25, where the conductive structure includes a plurality of conductive structures.

Example 26 provides the microelectronic assembly of any of examples 20-25, further including a support surface to which the conductive structure and the IC die are connected, the microelectronic assembly further including a third liner on at least a portion of the support surface between the mold material and the at least a portion of the support surface.

Example 27 provides the microelectronic assembly of example 26, where the third liner includes a material including silicon and nitrogen.

Example 28 provides the microelectronic assembly of any of examples 20-25, further including a support surface to which the IC die is connected, the microelectronic assembly further including the mold material on at last a portion of the first face of the IC die facing the support surface and a third liner between a t least a portion of the mold material on the at least a portion of the first face of the IC die and a portion of the support surface.

Example 29 provides the microelectronic assembly of example 28, where the third liner includes a material including silicon and nitrogen.

Example 30 provides the microelectronic assembly of any of examples 20-25, where a thickness of at least one of the first and second liners is between about 100 nanometer and 1 micrometer.

Example 31 provides the microelectronic assembly of any of examples 20-25, where at least one of the first and second liners includes silicon and nitrogen in a ratio of about 3 to 4.

Example 32 provides the microelectronic assembly of any of examples 20-25, further including a support surface, where at least one of the conductive structure and the IC die is connected to the support surface.

Example 33 provides the microelectronic assembly of example 32, where the support surface is over a package support.

Example 34 provides the microelectronic assembly of example 32, where the at least one of the IC die and the conductive structure is between the package support and the support surface.

Example 35 provides the microelectronic assembly of example 32, where the support surface is between the package support and the at least one of the conductive structure and the IC die.

Example 36 provides the microelectronic assembly of example 32, further including a carrier structure, where the support surface is between the carrier structure and the at least one of the conductive structure and the IC die.

Example 37 provides a method of fabricating a microelectronic assembly, the method including depositing a film over a surface of an IC structure on a carrier, where the IC structure includes at least one of an IC die and a conductive structure and the film includes silicon and nitrogen; and subsequent to the depositing, encapsulating the IC structure and the deposited film in a mold material.

Example 38 provides the method of example 37, where the depositing is performed at a temperature less than or equal to about 250 degrees Celsius.

Example 39 provides the method of any of examples 37-38, where a thickness of the deposited film is between about 100 nanometers and 1 micrometer.

Example 40 provides the method of any of examples 37-38, further including, prior to the depositing, etching the IC structure.

Example 43 provides the method of any of examples 37-38, where the depositing is performed using a PVD method.

Example 44 provides the method of any of examples 37-38, further including, subsequent to the encapsulating, grinding at least one surface of the microelectronic assembly.

Example 45 provides the method of any of examples 37-38, where the IC structure includes an IC die.

Example 46 provides the method of any of examples 37-38, where the IC structure includes a conductive structure.

Example 47 provides the method of example 46, where the conductive structure includes a pillar including copper.

Example 48 provides the method of any of examples 37-38, where the IC structure includes a conductive structure and an IC die.

Example 49 provides the method of any of examples 37-38, further including detaching the encapsulated IC structure from the carrier.

Example 50 provides the method of example 49, further including providing interconnects on the encapsulated IC structure.

Example 51 provides the method of example 50, further including connecting the encapsulated IC structure to a die with the interconnects.

Example 52 provides the method of example 50, further including connecting the encapsulated IC structure to a package support with the interconnects.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) package, comprising:
- a conductive structure over a surface;
- an IC die proximate the conductive structure and coupled to the surface, wherein the IC die has a first face facing the surface, a second face opposite the first face, and a side extending between the first face and the second face;
- an insulator material at least partially encasing the conductive structure;
- a first liner on a surface of the conductive structure, wherein the first liner is between the surface of the conductive structure and the insulator material, and wherein the first liner includes silicon and nitrogen; and,
- a second liner on the side of the IC die, wherein the second liner is between the side of the IC die and the insulator material.

2. The IC package of claim 1, wherein the conductive structure comprises a pillar.

3. The IC package of claim 1, wherein:
- the liner is a first liner,
- the IC package further includes a second liner on at least a portion of the surface, and
- the second liner includes silicon and nitrogen.

4. The IC package of claim 1, wherein the surface is between the conductive structure and a package substrate.

5. A microelectronic assembly, comprising:
- a conductive structure comprising a conductive pillar;
- an IC die proximate the conductive structure, the IC die comprising first and second faces opposite one another, and further comprising sides extending between the first and second faces;
- an insulator material encasing at least a portion of the IC die and the conductive structure;
- a first liner on a surface of the conductive structure, wherein the first liner is between the surface of the conductive structure and the insulator material; and
- a second liner on the sides of the IC die, wherein the second liner is between the sides of the IC die and the insulator material,
- wherein the first and second liners include silicon and nitrogen.

6. The microelectronic assembly of claim 5, wherein the IC die is a first IC die, and the microelectronic assembly further includes a second IC die coupled to at least one of the first IC die and the conductive structure.

7. The microelectronic assembly of claim 6, the microelectronic assembly further includes a package substrate, and wherein at least a portion of at least one of the first IC die and the conductive structure is between the package substrate and the second IC die.

8. The microelectronic assembly of claim 5, wherein the IC die is over a surface, and the microelectronic assembly further includes:
- the insulator material on at least a portion of the first face of the IC die facing the surface, and
- a third liner between at least a portion of the insulator material on the portion of the first face of the IC die and a portion of the surface.

9. The microelectronic assembly of claim 5, wherein at least one of the first liner and the second liner includes silicon and nitrogen in a ratio of approximately 3 to 4.

10. A process of making a microelectronic assembly, the process comprising:
- providing a conductive structure comprising a pillar that includes copper;
- providing an IC die proximate the conductive structure, the IC die comprising first and second faces opposite one another, and further comprising sides extending between the first and second faces;
- providing an insulator material encasing at least a portion of the IC die and the conductive structure;
- providing a first liner on a surface of the conductive structure, wherein the first liner is between the surface of the conductive structure and the insulator material; and
- providing a second liner on the sides of the IC die, wherein the second liner is between the sides of the IC die and the insulator material;
- wherein the first and second liners include silicon and nitrogen.

11. The process of claim 10, wherein the IC die is a first IC die, and the process further includes providing a second IC die coupled to at least one of the first IC die and the conductive structure.

12. The IC package of claim 1, wherein the second liner includes silicon and nitrogen.

13. The IC package of claim 1, wherein the conductive structure includes copper.

14. The IC package of claim 1, wherein the IC die is a first IC die, and the IC package further includes a second IC die coupled to at least one of the first IC die and the conductive structure.

15. The microelectronic assembly of claim 5, wherein the conductive pillar includes copper.

16. The microelectronic assembly of claim 5, further comprising a package substrate.

17. An integrated circuit (IC) package, comprising:
- a conductive structure over a surface;
- an IC die proximate the conductive structure and coupled to the surface, wherein the IC die has a first face facing the surface, a second face opposite the first face, and a side extending between the first face and the second face;
- an insulator material at least partially encasing the conductive structure, wherein a portion of the insulator material is on at least a portion of the first face of the IC die;

a first liner on a surface of the conductive structure, wherein the first liner is between the surface of the conductive structure and the insulator material, and wherein the first liner includes silicon and nitrogen; and a second liner on at least a portion of the surface, wherein the second liner is between the insulator material on the portion of the first face of the IC die and the portion of the surface.

18. The IC package of claim 17, wherein the second liner includes silicon and nitrogen.

19. The IC package of claim 17, wherein the surface is between the conductive structure and a package substrate.

20. The IC package of claim 17, wherein the IC die is a first IC die, and the IC package further includes a second IC die coupled to at least one of the first IC die and the conductive structure.

* * * * *